(12) United States Patent
Anderson et al.

(10) Patent No.: US 9,842,931 B1
(45) Date of Patent: Dec. 12, 2017

(54) SELF-ALIGNED SHALLOW TRENCH ISOLATION AND DOPING FOR VERTICAL FIN TRANSISTORS

(71) Applicant: INTERNATIONAL BUSINESS MACHINES CORPORATION, Armonk, NY (US)

(72) Inventors: Brent A. Anderson, Jericho, VT (US); Fee Li Lie, Albany, NY (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/178,193

(22) Filed: Jun. 9, 2016

(51) Int. Cl.
*H01L 29/78* (2006.01)
*H01L 29/06* (2006.01)
*H01L 29/66* (2006.01)
*H01L 21/762* (2006.01)
*H01L 21/02* (2006.01)
(Continued)

(52) U.S. Cl.
CPC ........ *H01L 29/785* (2013.01); *H01L 21/0214* (2013.01); *H01L 21/0217* (2013.01); *H01L 21/0228* (2013.01); *H01L 21/02164* (2013.01); *H01L 21/02186* (2013.01); *H01L 21/76224* (2013.01); *H01L 21/823431* (2013.01); *H01L 21/823481* (2013.01); *H01L 27/0886* (2013.01); *H01L 29/0649* (2013.01); *H01L 29/66666* (2013.01); *H01L 29/66795* (2013.01); *H01L 29/7827* (2013.01)

(58) Field of Classification Search
CPC ............... H01L 29/785; H01L 21/0214; H01L 21/02186; H01L 21/0228; H01L 21/76224; H01L 21/823431; H01L 21/823481; H01L 27/0886; H01L 29/7827
See application file for complete search history.

(56) References Cited

U.S. PATENT DOCUMENTS

| 5,128,272 A | 7/1992 | Ramde |
| 5,326,711 A | 7/1994 | Malhi |
| 5,539,229 A | 7/1996 | Noble, Jr et al. |

(Continued)

FOREIGN PATENT DOCUMENTS

| CA | 1271266 | 7/1990 |
| WO | 02086904 | 10/2002 |

(Continued)

*Primary Examiner* — Nathan W Ha
(74) *Attorney, Agent, or Firm* — Tutunjian & Bitetto, P.C.; Vazken Alexanian

(57) ABSTRACT

A method of forming a vertical fin field effect transistor (vertical finFET) with a self-aligned shallow trench isolation region, including forming a pinch-off layer on one or more vertical fin segments, wherein the pinch-off layer has a thickness on the sidewalls of the one or more vertical fin segments, forming a trench mask layer on predetermined portions of the pinch-off layer, removing portions of the pinch-off layer not covered by the trench mask layer, where the removed portions of the pinch-off layer exposes underlying portions of the substrate, and removing at least a portion of the substrate to form one or more isolation region trenches, where the distance of the sidewall of one of the one or more isolation region trenches to an adjacent vertical fin segment is determined by the thickness of the pinch-off layer.

15 Claims, 18 Drawing Sheets

(51) Int. Cl.
*H01L 27/088* (2006.01)
*H01L 21/8234* (2006.01)

(56) References Cited

U.S. PATENT DOCUMENTS

| | | | |
|---|---|---|---|
| 6,104,061 | A | 8/2000 | Forbes et al. |
| 6,150,210 | A | 11/2000 | Arnold |
| 6,194,773 | B1 | 2/2001 | Malhi |
| 7,560,728 | B2 | 7/2009 | Lin et al. |
| 7,791,068 | B2 | 9/2010 | Meng et al. |
| 8,383,477 | B2 | 2/2013 | Lee |
| 8,471,310 | B2 | 6/2013 | Hynecek |
| 8,652,889 | B2 | 2/2014 | Wei et al. |
| 8,828,839 | B2 | 9/2014 | Brunco et al. |
| 9,048,329 | B2 | 6/2015 | Kim et al. |
| 9,219,001 | B2 | 12/2015 | Wilson et al. |
| 9,263,580 | B2 | 2/2016 | Jacob et al. |
| 2003/0015755 | A1 | 1/2003 | Hagemeyer |
| 2006/0088967 | A1 | 4/2006 | Hsiao et al. |
| 2008/0197397 | A1 | 8/2008 | Parthasarathy et al. |
| 2010/0300357 | A1* | 12/2010 | Yamamoto ............ C23C 16/345 118/723 E |
| 2011/0006360 | A1 | 1/2011 | Ikebuchi |
| 2012/0164816 | A1* | 6/2012 | Matsuda ................ C23C 16/308 438/424 |
| 2012/0214285 | A1 | 8/2012 | Guha et al. |
| 2015/0279723 | A1 | 10/2015 | Adam et al. |
| 2015/0279997 | A1 | 10/2015 | Koldiaev et al. |
| 2015/0333155 | A1 | 11/2015 | Liu et al. |
| 2016/0358777 | A1* | 12/2016 | Hatakeyama ....... H01L 21/0337 |
| 2016/0358933 | A1* | 12/2016 | Rabkin ............ H01L 27/11582 |
| 2016/0365245 | A1* | 12/2016 | Huang ............ H01L 21/02271 |

FOREIGN PATENT DOCUMENTS

| | | |
|---|---|---|
| WO | 2005091376 | 9/2005 |
| WO | 2013123287 | 8/2013 |

* cited by examiner

SELF-ALIGNED SHALLOW TRENCH ISOLATION AND DOPING FOR VERTICAL FIN TRANSISTORS

BACKGROUND

Technical Field

The present invention generally relates to self-aligned shallow trench isolation regions and masking of doped substrate regions, and more particularly to an approach to control the alignment of mask layers with semiconductor device features to reduce dimensional variations.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and finFETs have been formed with the channel extending outward from the substrate, but where the current also flows horizontally from a source to a drain. The channel for the finFET can be an upright slab of thin rectangular Si, commonly referred to as the fin with a gate on the fin, as compared to a MOSFET with a single gate in the plane of the substrate. Depending on the doping of the source and drain, an n-FET or a p-FET may be formed.

Examples of FETs can include a metal-oxide-semiconductor field effect transistor (MOSFET) and an insulated-gate field-effect transistor (IGFET). Two FETs also may be coupled to form a complementary metal oxide semiconductor (CMOS), where a p-channel MOSFET and n-channel MOSFET are coupled together.

With ever decreasing device dimensions, forming the individual components and electrical contacts become more difficult. An approach is therefore needed that retains the positive aspects of traditional FET structures, while overcoming the scaling issues created by forming smaller device components.

SUMMARY

In accordance with an embodiment of the present principles, a method is provided for forming a vertical fin field effect transistor (vertical finFET) with a self-aligned shallow trench isolation region. The method includes forming a pinch-off layer on one or more vertical fin segments, wherein the pinch-off layer has a thickness on the sidewalls of the one or more vertical fin segments. The method further includes the steps of forming a trench mask layer on predetermined portions of the pinch-off layer, and removing portions of the pinch-off layer not covered by the trench mask layer, where the removed portions of the pinch-off layer exposes underlying portions of the substrate. The method further includes the step of removing at least a portion of a substrate to form one or more isolation region trenches, where the distance of the sidewall of one of the one or more isolation region trenches to an adjacent vertical fin segment is determined by the thickness of the pinch-off layer.

In accordance with an embodiment of the present principles, a method is provided for forming a vertical fin field effect transistor (vertical finFET) with a self-aligned shallow trench isolation region. The method includes forming one or more vertical fins by a sidewall image transfer process, and forming a pinch-off layer on one or more vertical fin segments, wherein the pinch-off layer has a thickness on the sidewalls of the one or more vertical fin segments. The method further includes the steps of forming a trench mask layer on predetermined portions of the pinch-off layer, and removing portions of the pinch-off layer not covered by the trench mask layer, where the removed portions of the pinch-off layer exposes underlying portions of the substrate. The method further includes the step of removing at least a portion of the substrate to form one or more isolation region trenches, where the distance of the sidewall of one of the one or more isolation region trenches to an adjacent vertical fin segment is determined by the thickness of the pinch-off layer.

In accordance with an embodiment of the present principles, a semiconductor device structure is provided. The semiconductor device structure includes a plurality of vertical fin segments on a substrate separated by one or more fin gaps and/or one or more fin trenches. The semiconductor device structure further includes a pinch-off layer covering the plurality of vertical fin segments and at least a portion of the surface of the substrate in the one or more fin gaps and/or one or more fin trenches, and one or more trench mask blocks in at least a portion of at least one of the one or more fin gaps or at least one of the one or more fin trenches; where the one or more trench mask blocks covers at least a portion of the pinch-off layer in the one or more fin gaps and/or one or more fin trenches.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
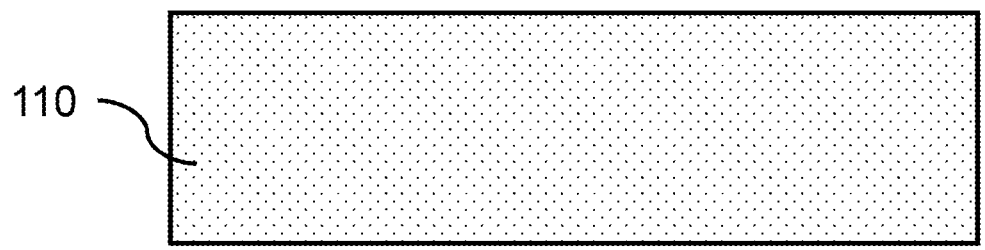
FIG. 1 shows a cross-sectional side view of a substrate, in accordance with an embodiment of the present principles.

Principles and embodiments of the present disclosure relate generally to controlling feature locations, dimensions, and inter-feature pitch by reducing or avoiding variations in feature placement due to the misalignment of mask layers. Self-alignment is typically a process in which control of the placement/formation of device features/components is not limited by the tolerance of control on the positioning of a lithography mask. A device component (e.g., a spacer) or feature (e.g., doped region) may be located through control of component widths and/or layer thicknesses, or avoidance of sequential mask positionings that may introduce cumulative placement errors. One or more device features may, thereby, be self-aligned with other device features through the use of already defined feature dimensions and locations.

For each lithography step, a lithography mask must be aligned with features already present on a substrate, and the location of future fabricated features may also be taken into account. The continued reduction in feature sizes has made this alignment more and more difficult. Two such features implemented in the construction of vertical fin field effect transistors (vertical finFETs) is the doped region in the substrate, that may form a bottom source/drain, and a shallow trench isolation (STI) region that may be formed in the substrate to electrically separate two neighboring devices. A problem that can arise is the ability to align a lithography mask with one or more fins already patterned and formed on the substrate. Misalignment of the lithography mask can result in the misplacement of a masked area or an opening in a mask layer after patterning and development. Features present on the substrate, therefore, may not be sufficiently covered by a protective masking layer, and/or an opening in the mask layer may be located in an unacceptable position resulting in the incorrect placement of a subsequent feature, for example, a trench for an STI. Subsequent etchings or depositions may create device features that are too close together, too far apart, not sufficiently overlapping, or interfering, for example, due to excessive overlap.

In one or more embodiments, an opening in a mask may be suitably aligned with the location of existing fins on a substrate to allow formation of a bottom source/drain below the fins through an ion implantation process. A doped bottom plate may be formed in a region of the substrate that overlaps the position of the existing fins on the substrate. Alignment of the mask may be controlled by relying on the thickness of a layer on the vertical surfaces of adjacent device features to define the location of an opening and subsequent etching and/or depositions.

In one or more embodiments, a hardmask layer may be formed on the surfaces perpendicular to the substrate surface by a conformal deposition that allows accurate control of the hardmask layer thickness on both the vertical surfaces and the substrate surface. Control of the layer thickness on the vertical surfaces can provide controlled displacement of an opening from the vertical surface by a lateral distance equal to the thickness. In various embodiments, the thickness of a conformally deposited hardmask layer may be sufficient to fill the space between two adjacent vertical fins, and thereby pinch off the region between the fins.

Exemplary applications/uses to which the present principles can be applied include, but are not limited to: formation of vertical finFETs, complementary metal oxide silicon (CMOS) field effect transistors (FETs) formed by coupled finFETs, and digital gate devices (e.g., NAND, NOR, XOR, etc.).

In various embodiments, the materials and layers may be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions may be epitaxial processes, and the deposited material may be crystalline. In various embodiments, formation of a layer may be by one or more deposition processes, where, for example, a conformal layer may be formed by a first process (e.g., ALD, PE-ALD, etc.) and a fill may be formed by a second process (e.g., CVD, electrodeposition, PVD, etc.).

Referring now to the drawings in which like numerals represent the same or similar elements and initially to FIG. 1, shows a cross-sectional side view of a substrate in accordance with an exemplary embodiment.

In one or more embodiments, a substrate 110 may be a semiconductor or an insulator with an active surface semiconductor layer. At least a portion of the substrate may be crystalline, semi-crystalline, microcrystalline, or amorphous. The substrate may be essentially (i.e., except for contaminants) a single element (e.g., silicon), primarily (i.e., with doping) of a single element, for example, silicon (Si) or germanium (Ge), or the substrate may include a compound, for example, $Al_2O_3$, $SiO_2$, GaAs, SiC, or SiGe. The substrate may also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate may also have other layers forming the substrate, including high-k oxides and/or nitrides. In one or more embodiments, the substrate 110 may be a silicon wafer. In an embodiment, the substrate may be a single crystal silicon (Si), silicon germanium (SiGe), or III-V semiconductor (e.g., GaAs) wafer, or have a single crystal silicon (Si), silicon germanium (SiGe), or III-V semiconductor (e.g., GaAs) surface/active layer.

In various embodiments, a sidewall image transfer (SIT) technique may be used to form one or more vertical fins 111 on the substrate. In a typical SIT process, spacers are formed on the sidewall of a sacrificial mandrel. The sacrificial mandrel is removed and the remaining upright spacers are used to pattern the hardmask fin template(s) 121. The hardmask fin template(s) 121 are used as a mask during the etch of a top portion of a semiconductor layer to form one or more vertical fins 111. The upright spacers are then removed after the semiconductor vertical fins 111 have been formed. In various embodiments, the substrate may be a single crystal Si substrate and the vertical fins may be single crystal silicon.

Figure 2:
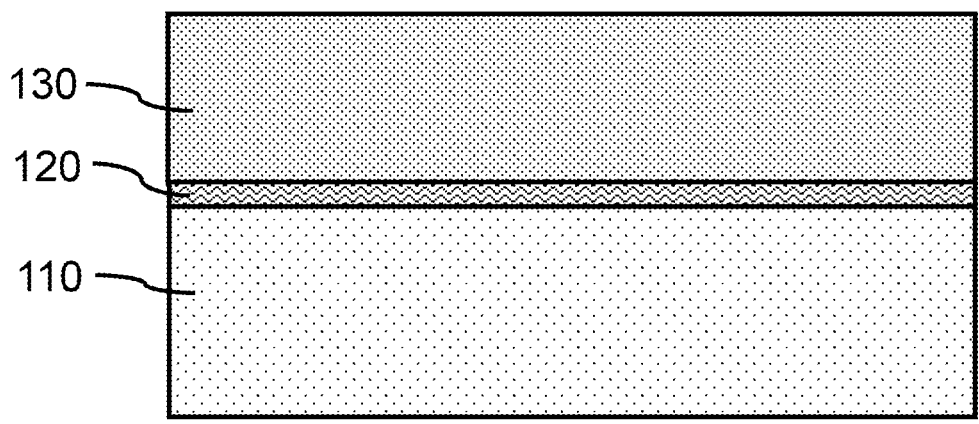
FIG. 2 shows a cross-sectional side view of a hardmask layer and a liner layer, on a substrate, in accordance with an embodiment of the present principles.

FIG. 2 shows a cross-sectional side view of a hardmask layer and a liner layer, on a substrate, in accordance with an embodiment of the present principles.

In one or more embodiments, a thin liner layer 120 may be formed on at least a portion of the substrate 110. A hardmask layer 130 may be formed on at least a portion of the liner layer 120. In one or more embodiments, the liner layer 120 and hardmask layer 130 may form one or more fin templates.

In one or more embodiments, the thin liner layer 120 may have a thickness in the range of about 1 nm to about 10 nm, or in the range of about 2 nm to about 5 nm.

In various embodiments, liner layer 120 may be an oxide, for example, silicon oxide (SiO), silicon oxynitride (SiON), or a combination thereof. The liner layer 120 may protect the underlying substrate material from having defects introduced by a silicon nitride deposition.

In one or more embodiments, the hardmask layer 130 may have a thickness in the range of about 20 nm to about 100 nm, or in the range of about 35 nm to about 75 nm, or in the range of about 45 nm to about 55 nm.

In various embodiments, hardmask layer 130 may be a nitride, for example, silicon nitride (SiN), silicon oxynitride (SiON), or a combination thereof. In various embodiments, the liner layer 120 is a different material than the hardmask layer 130, such that the liner layer 120 may act as an etch stop layer.

Figure 3:
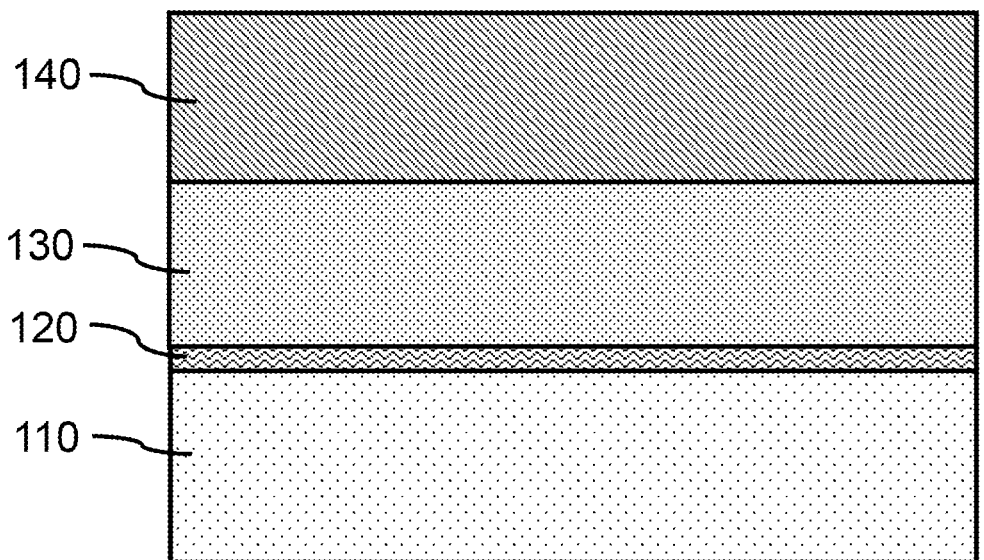
FIG. 3 shows a cross-sectional side view of a sacrificial mandrel layer on the hardmask layer and liner layer, on a substrate, in accordance with an embodiment of the present principles.

FIG. 3 shows a cross-sectional side view of a sacrificial mandrel layer on the hardmask layer and liner layer, on a substrate, in accordance with an embodiment of the present principles.

In one or more embodiments, a sacrificial mandrel layer 140 may be formed on at least a portion of the hardmask layer 130. The sacrificial mandrel layer 140 may be a semiconductor material, for example, amorphous silicon (a-Si), polycrystalline silicon (p-Si), microcrystalline silicon (m-Si), amorphous carbon (a-C), or combinations thereof.

Figure 4:
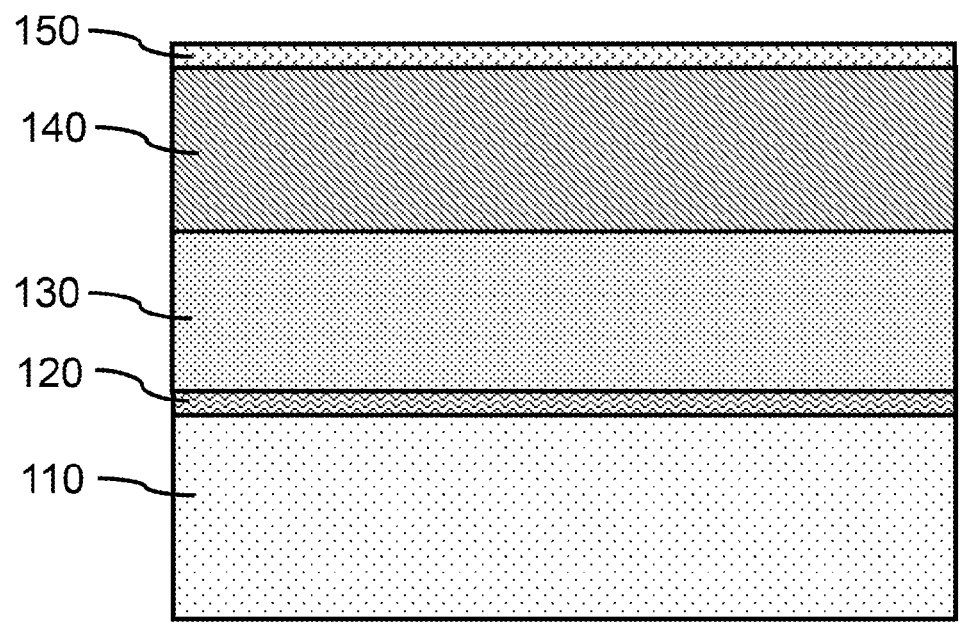
FIG. 4 shows a cross-sectional side view of a photo-mask layer on the sacrificial mandrel layer and hardmask layer, in accordance with an embodiment of the present principles.

FIG. 4 shows a cross-sectional side view of a photo-mask layer on the sacrificial mandrel layer and hardmask layer, in accordance with an embodiment of the present principles.

In one or more embodiments, a photo-mask layer 150 may be formed on at least a portion of the sacrificial mandrel layer 140, where the photo-mask layer 150 may be a soft mask, for example, poly methyl methacrylate (PMMA), that may be patterned and developed to form opening(s) and mask feature(s). In various embodiments, the photo-mask layer 150 may be patterned and developed to form one or more photo-mask blocks 151, that cover a portion of the sacrificial mandrel layer 140, while exposing portions of the sacrificial mandrel layer 140.

Figure 5:
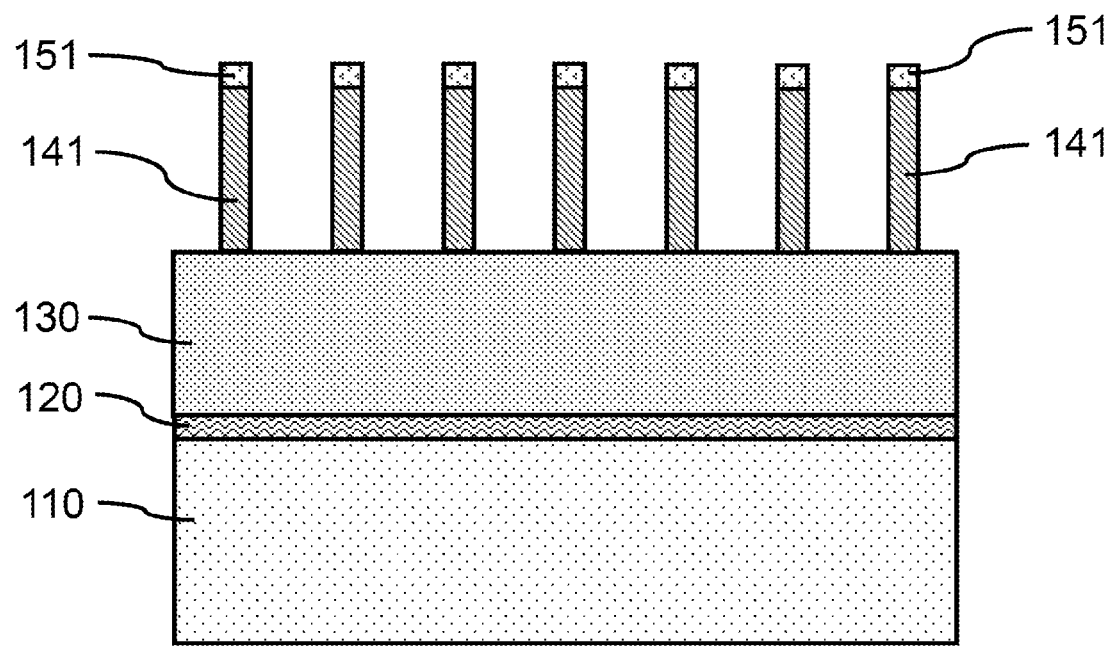
FIG. 5 shows a cross-sectional side view of a photo-mask block on each of a plurality of sacrificial mandrels on the hardmask layer, in accordance with an embodiment of the present principles.

FIG. 5 shows a cross-sectional side view of a photo-mask block on each of a plurality of sacrificial mandrels on the hardmask layer, in accordance with an embodiment of the present principles.

In one or more embodiments, a plurality of sacrificial mandrels 141 may be formed from the sacrificial mandrel layer 140, where an anisotropic etch may be used to form the sacrificial mandrels 141. An anisotropic etch may be a dry plasma etch, for example, a reactive ion etch (RIE), that preferentially removes material from the sacrificial mandrel layer 140 in a direction normal to the surface, while limiting etching of the sidewalls. The plurality of sacrificial mandrels 141 may act as templates for forming spacers.

In one or more embodiments, the sacrificial mandrels 141 may have a width in the range of about 5 nm to about 60 nm, or in the range of about 10 nm to about 40 nm.

In one or more embodiments, the plurality of sacrificial mandrels 141 may have a pitch between adjacent sacrificial mandrels 141. The pitch between adjacent sacrificial mandrels 141 may be in the range of about 20 nm to about 200 nm, or in the range of about 70 nm to about 120 nm, or in the range of about 24 nm to about 80 nm, or in the range of about 35 nm to about 100 nm.

Figure 6:
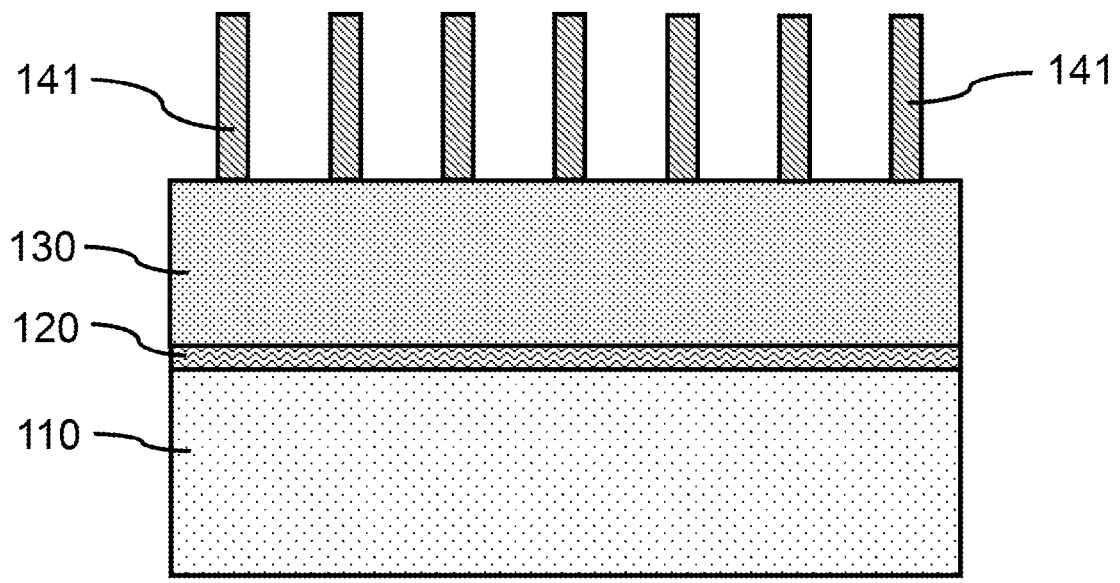
FIG. 6 shows a cross-sectional side view of a plurality of sacrificial mandrels on the hardmask layer after removal of the photo-mask blocks, in accordance with an embodiment of the present principles

FIG. 6 shows a cross-sectional side view of a plurality of sacrificial mandrels on the hardmask layer after removal of the photo-mask blocks, in accordance with an embodiment of the present principles.

In one or more embodiments, the photo-mask blocks 151 may be removed from each of sacrificial mandrels 141 by a suitable method (e.g., ashing, disolving, etc.), as would be known in the art. Removal of the photo-mask blocks 151 may expose the top surface of the sacrificial mandrels 141.

Figure 7:
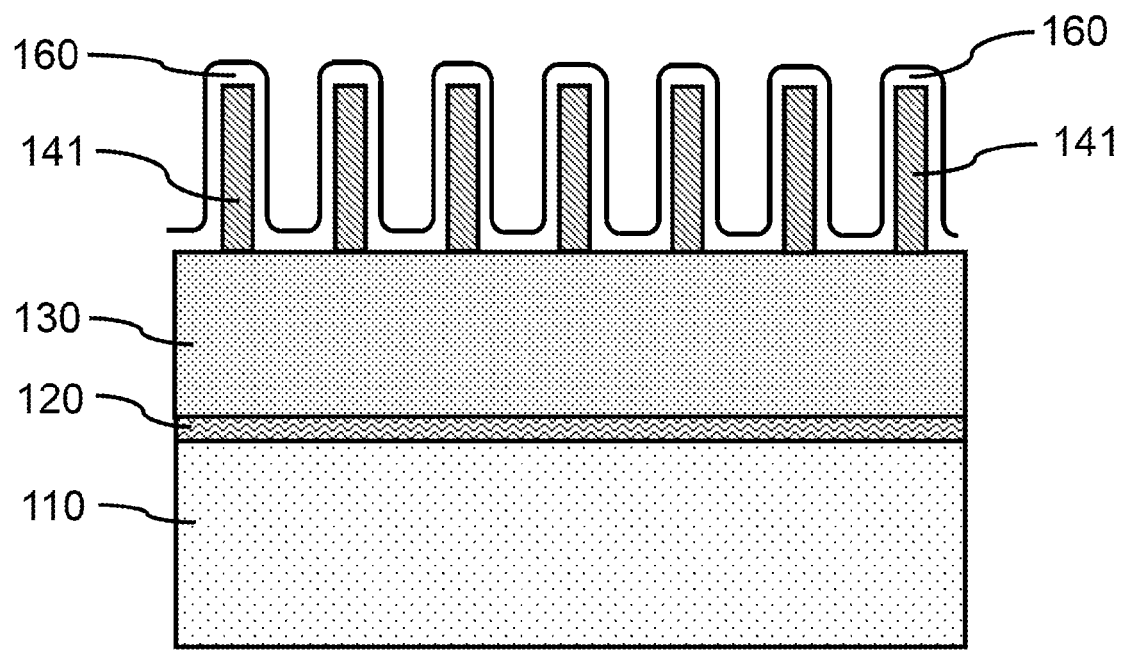
FIG. 7 shows a cross-sectional side view of a spacer layer on the plurality of sacrificial mandrels, in accordance with an embodiment of the present principles.

FIG. 7 shows a cross-sectional side view of a spacer layer on the plurality of sacrificial mandrels, in accordance with an embodiment of the present principles.

In one or more embodiments, a spacer layer 160 may be formed on one or more of the sacrificial mandrels 141. The spacer layer 160 may be formed by a blanket deposition over the sacrificial mandrels 141 and exposed portions of the surface of the hardmask layer 130, where the blanket deposition may be a conformal deposition, for example by ALD, CVD, or a combination thereof.

In one or more embodiments, the spacer layer 160 may be an oxide, for example, silicon oxide (SiO). The spacer layer 160 may be a different material than the hardmask layer 130, such that the hardmask layer 130 acts as an etch stop.

In one or more embodiments, the spacer layer 160 may have a thickness in the range of about 3 nm to about 25 nm, or in the range of about 5 nm to about 20 nm, where the thickness of the spacer layer 160 may determine the width of the spacers and fin templates, and ultimately the width of the fins.

Figure 8:
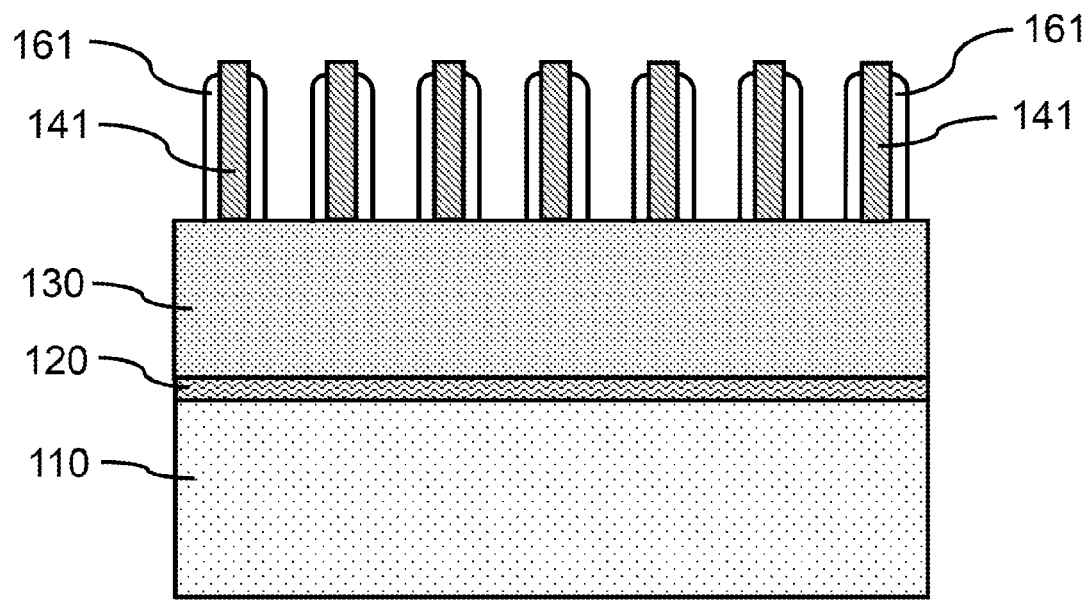
FIG. 8 shows a cross-sectional side view of a plurality of spacers on opposing sides of the plurality of sacrificial mandrels, in accordance with an embodiment of the present principles.

FIG. 8 shows a cross-sectional side view of a plurality of spacers on opposing sides of the plurality of sacrificial mandrels, in accordance with an embodiment of the present principles.

In one or more embodiments, a portion of the spacer layer 160 on the surface of the hardmask layer 130 between the sacrificial mandrels 141, and portions of the spacer layer 160 on the top surface of the sacrificial mandrels 141, may be removed to form spacers 161. Portions of the hardmask layer 130 may be exposed by removal of portions of the spacer layer 160. In various embodiments, portions of the spacer layer 160 may be removed by etching in a manner that reduces the height of the spacer layer 160 (e.g., an etch-back) on the sidewalls of the sacrificial mandrels 141, and exposes the top surface of the sacrificial mandrels.

Figure 9:
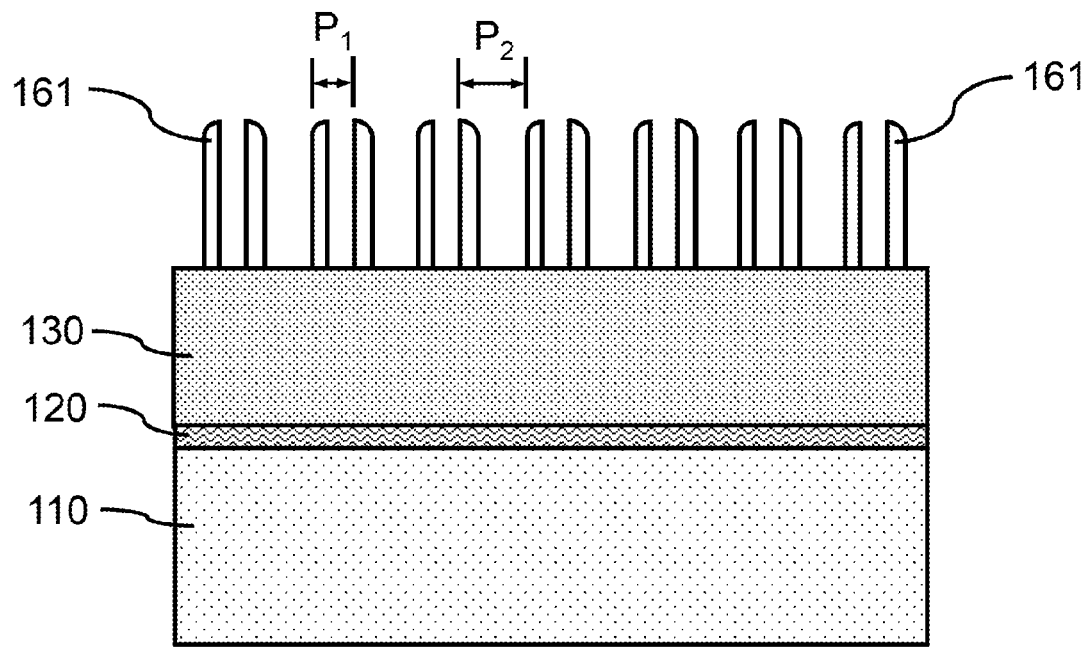
FIG. 9 shows a cross-sectional side view of a plurality of free-standing spacers after removal of the sacrificial mandrels, in accordance with an embodiment of the present principles.

FIG. 9 shows a cross-sectional side view of a plurality of free-standing spacers after removal of the sacrificial mandrels, in accordance with an embodiment of the present principles.

In one or more embodiments, the sacrificial mandrels 141 may be removed to form a plurality of free-standing spacers 161, where the spacers may have a first pitch, $P_1$, controlled by the width of the sacrificial mandrels 141, and a second pitch, $P_2$, controlled by the pitch of the sacrificial mandrels 141. The sacrificial mandrels 141 may be removed by a selective isotropic etch that removes the material of the sacrificial mandrels 141 without notably effecting the spacers 161 or hardmask layer 130.

In various embodiments, the pattern of the spacers 161 may be transferred to the hardmask layer 130.

Figure 10:
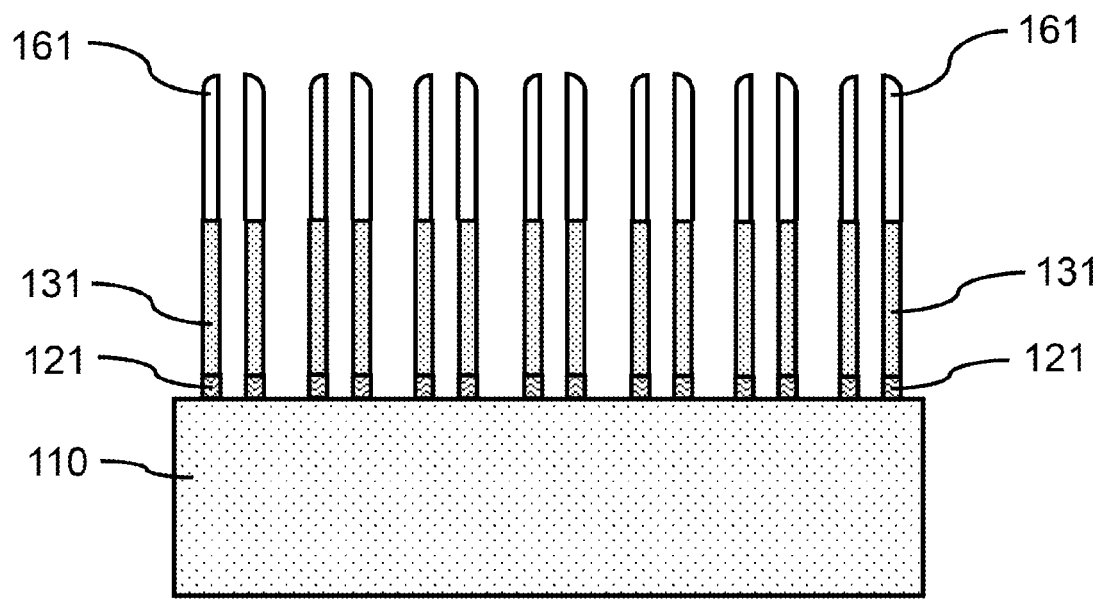
FIG. 10 shows a cross-sectional side view of a plurality of free-standing spacers on a plurality of hardmask fin templates, in accordance with an embodiment of the present principles.

FIG. 10 shows a cross-sectional side view of a plurality of free-standing spacers on a plurality of hardmask fin templates, in accordance with an embodiment of the present principles.

In one or more embodiments, portions of the hardmask layer 130 between the free-standing spacers 161 may be removed by a directional etch to form a plurality of hardmask fin templates 131.

In various embodiments, portions of the liner layer 120 between the hardmask fin templates 131 may be removed by a directional etch to form template liners 121, and expose at least portions of the surface of the substrate. In various embodiments, portions of the hardmask layer 130 and/or liner layer 120 may be removed by RIE.

Figure 11:
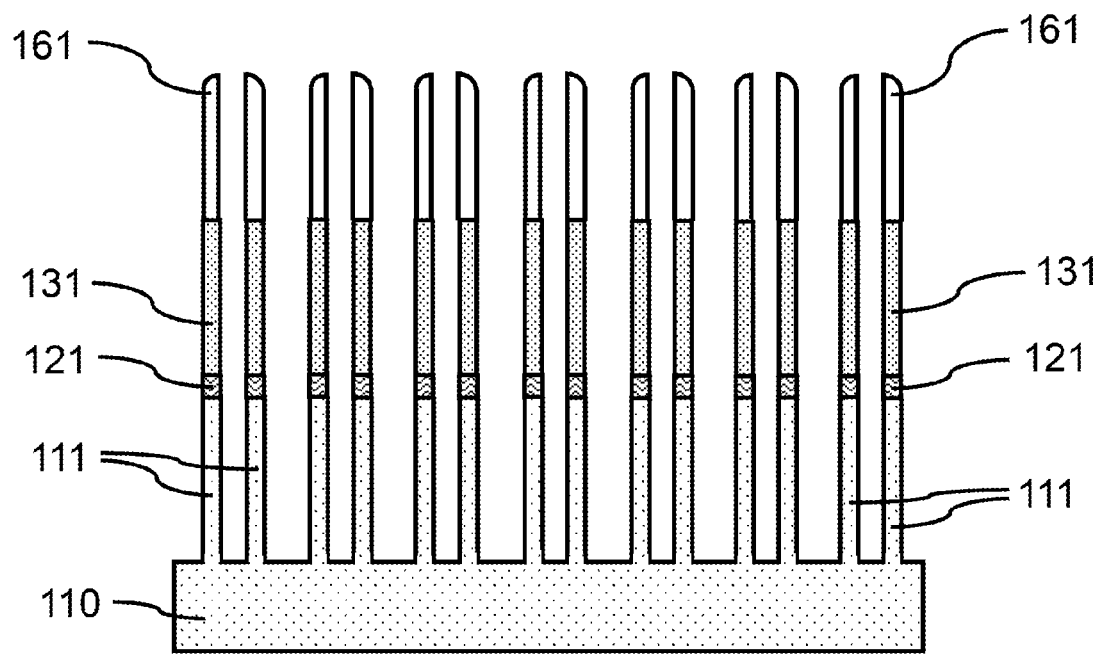
FIG. 11 shows a cross-sectional side view of a plurality of spacers and hardmask fin templates on a plurality of fins formed in the substrate, in accordance with an embodiment of the present principles.

FIG. 11 shows a cross-sectional side view of a plurality of spacers and hardmask fin templates on a plurality of fins formed in the substrate, in accordance with an embodiment of the present principles.

In one or more embodiments, one or more fin(s) 111 may be formed in the substrate 110 using the spacers 161 and/or hardmask fin templates 131. In various embodiments, the spacers 161 may be removed prior to formation of the fins 111, and the hardmask fin templates 131 may be used to mask the substrate 110. In various embodiments, the spacers 161 may be removed after the formation of the fins 111.

Figure 12:
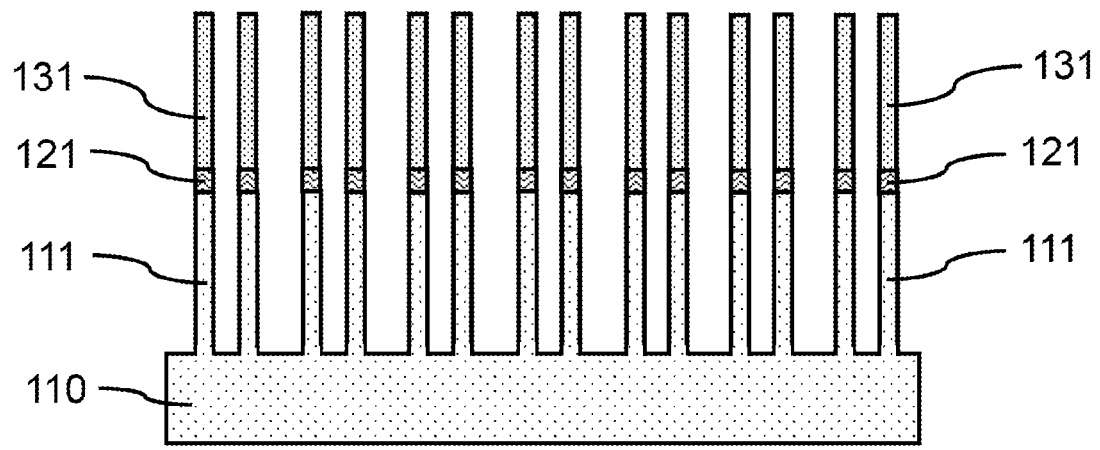
FIG. 12 shows a cross-sectional side view of a plurality of hardmask fin templates and template liners on a plurality of fins formed in the substrate after removal of the spacers, in accordance with an embodiment of the present principles.

FIG. 12 shows a cross-sectional side view of a plurality of hardmask fin templates on a plurality of fins formed in the substrate after removal of the spacers, in accordance with an embodiment of the present principles.

In one or more embodiments, the spacers 161 may be selectively removed to expose the top surface of the hardmask fin templates 131.

Figure 13:
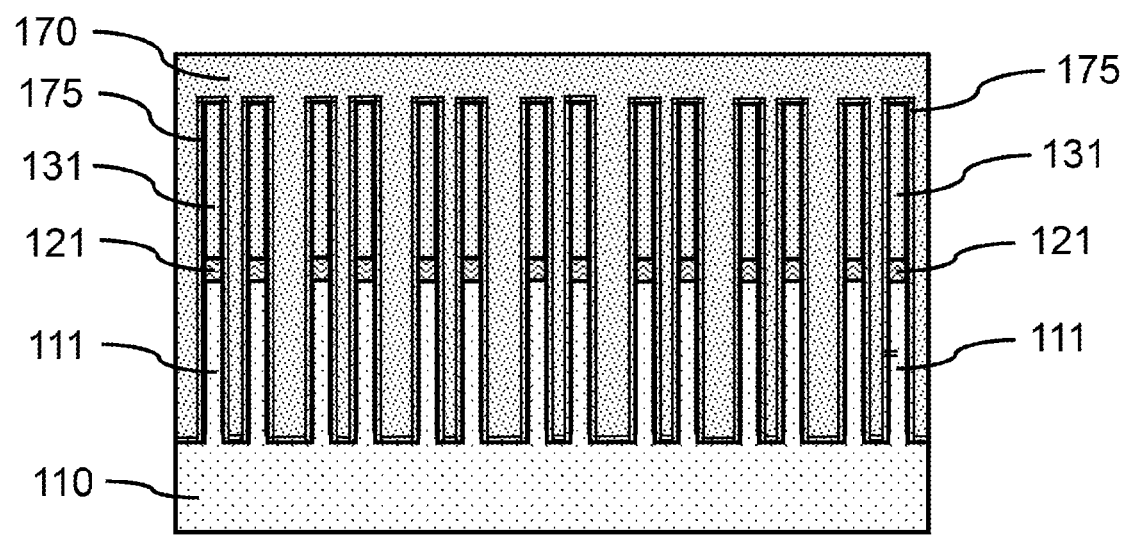
FIG. 13 shows a cross-sectional side view of a filler layer covering the plurality of hardmask fin templates and vertical fins on the substrate, in accordance with an embodiment of the present principles.

FIG. 13 shows a cross-sectional side view of a filler layer covering the plurality of hardmask fin templates and vertical fins on the substrate, in accordance with an embodiment of the present principles.

In one or more embodiments, a filler layer 170 may be formed on the one or more hardmask fin templates 131, template liners 121, and vertical fins 111. The filler layer 170 may fill in the gaps between each of the hardmask fin templates 131, template liners 121, and vertical fins 111 and extend above the top surface of the hardmask fin templates 131, where the filler layer 170 may be conformally deposited, for example, by ALD and/or CVD.

In various embodiments, a protective liner 175 may be formed on the hardmask fin templates 131, template liners 121, and vertical fins 111 before formation of the filler layer 170, where the protective liner 175 may be a silicon nitride (e.g., $Si_3N_4$) conformally deposited on the exposed surfaces of the hardmask fin templates 131, template liners 121, and vertical fins 111. The protective liner 175 may protect the fin(s) from damage during formation of the filler layer 170 and/or subsequent processing steps.

Figure 14:
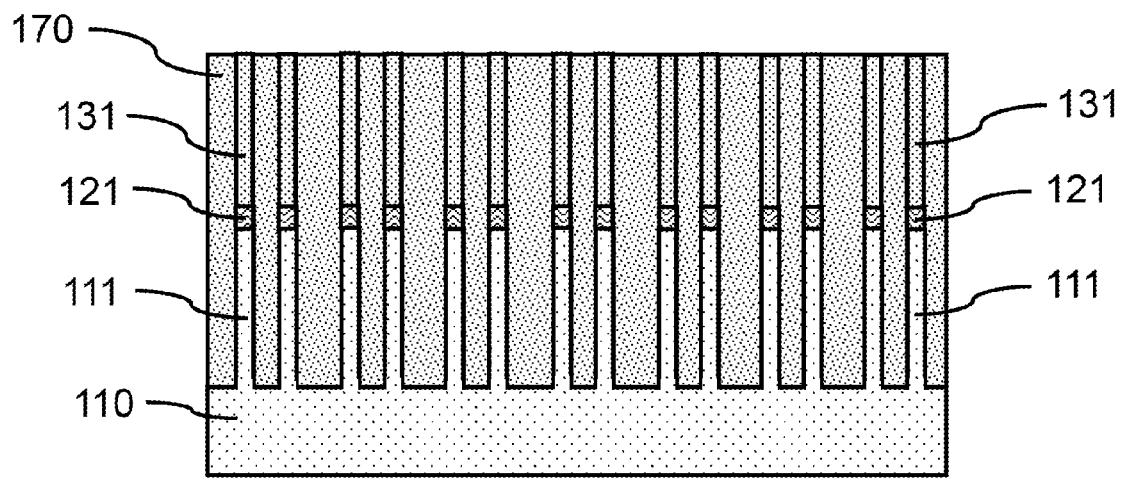
FIG. 14 shows a cross-sectional side view of a filler layer and hardmask fin templates having a flat top surface, in accordance with an embodiment of the present principles.

FIG. 14 shows a cross-sectional side view of a filler layer and hardmask fin templates having a flat top surface, in accordance with an embodiment of the present principles.

In one or more embodiments, a chemical-mechanical polishing (CMP) may be used to remove filler layer material above the top surface of the hardmask fin templates 131, and reduce the height of the filler layer 170 to form a flat, uniform surface with the top surface of the hardmask fin templates 131. The filler layer 170 may provide mechanical support to the hardmask fin templates 131, template liners 121, and vertical fins 111 during chemical-mechanical polishing, and provide a uniform surface for formation of a subsequent fin-cut mask layer.

Figure 15:
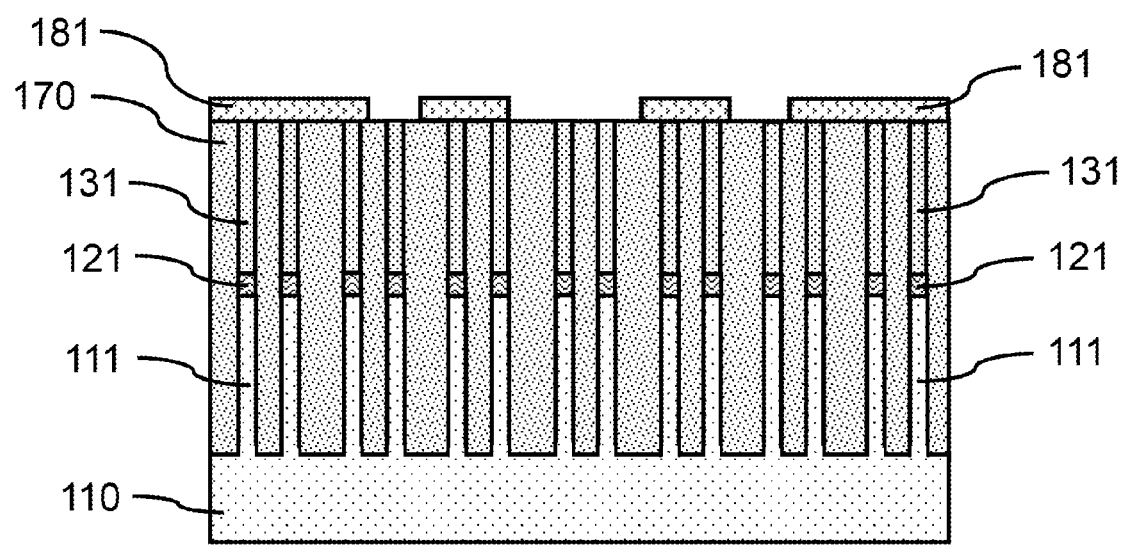
FIG. 15 shows a cross-sectional side view of a patterned fin-cut mask layer on the flat surface of the filler layer and hardmask fin templates, in accordance with an embodiment of the present principles.

FIG. 15 shows a cross-sectional side view of a patterned fin-cut mask layer on the flat surface of the filler layer and hardmask fin templates, in accordance with an embodiment of the present principles.

In one or more embodiments, a fin-cut mask layer may be formed on at least a portion of the surface of the filler layer 170 and hardmask fin templates 131, and patterned and developed to form fin-cut mask blocks 181, where the fin-cut mask blocks 181 cover selected hardmask fin templates 131, while leaving one or more predetermined hardmask fin templates 131 exposed.

In various embodiments, the fin-cut mask blocks 181 do not have to precisely cover portions of the flat surface with the selected hardmask fin templates 131. The positioning of the fin-cut mask blocks 181 can have a tolerance equal to or less than the distance of the first pitch, $P_1$, and/or the second pitch, $P_2$, (e.g., whichever is smaller), as long as the fin-cut mask block 181 covers the particular hardmask fin templates 131 that are to remain. The fin-cut mask blocks 181 are a different material than the hardmask fin templates 131 and filler layer 170, so the in-cut mask blocks are not etched during removal of the selected hardmask fin templates and filler layer. In various embodiments, the fin-cut mask layer and fin-cut mask blocks 181 may be an organic lithography material that may allow etching of both an oxide filler layer and a nitride fin template at the same time, as would be known in the art. In various embodiments, the fin-cut mask layer may include two or more different layers.

Figure 16:
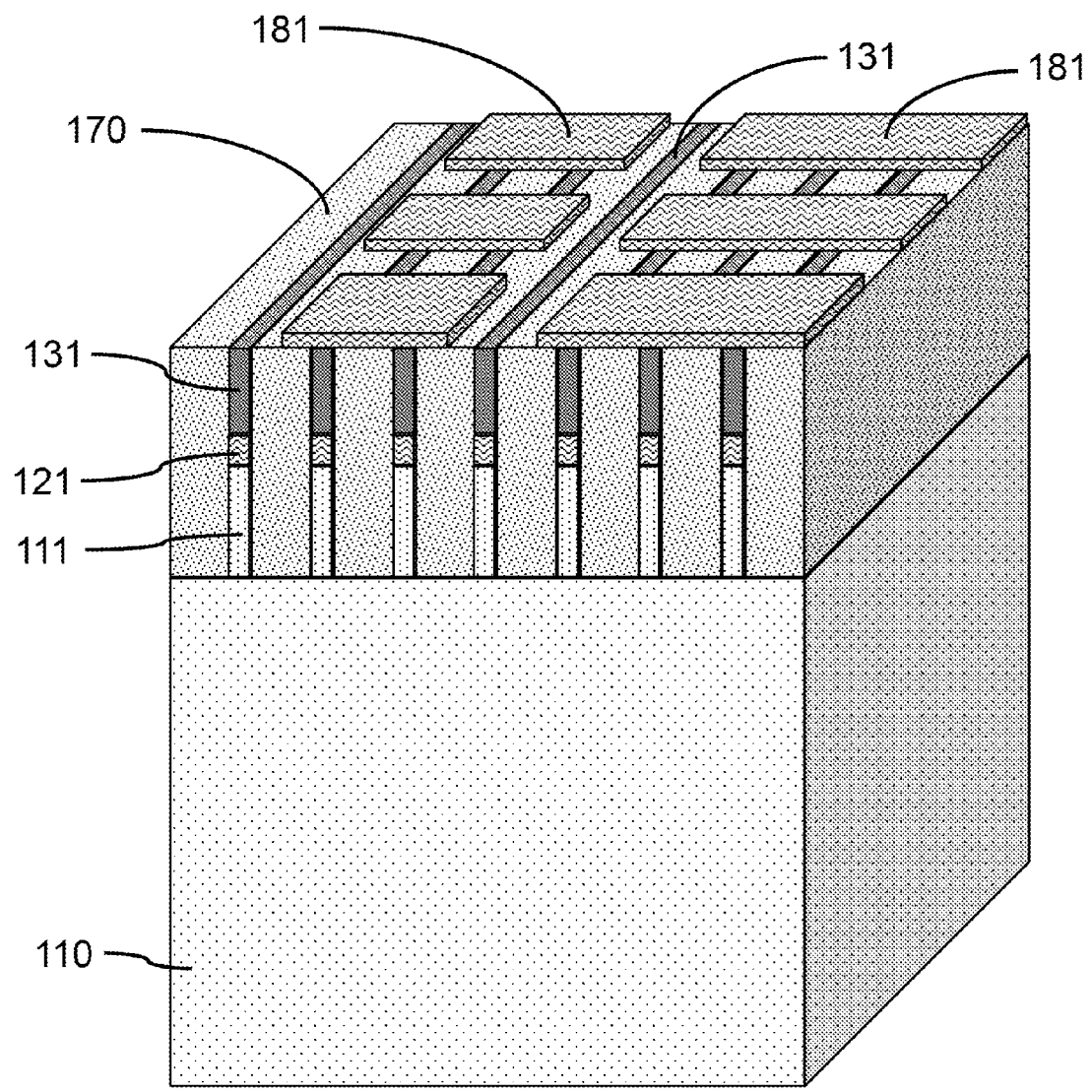
FIG. 16 shows a cross-sectional perspective view of a patterned fin-cut mask layer on the flat surface of the filler layer and hardmask fin templates, in accordance with an embodiment of the present principles.

FIG. 16 shows a cross-sectional perspective view of a patterned fin-cut mask layer on the flat surface of the filler layer and hardmask fin templates, in accordance with an embodiment of the present principles.

In one or more embodiments, the fin-cut mask blocks 181 may be arranged in a 2-dimensional pattern on the surface of the filler layer 170 and hardmask fin templates 131 to expose portions of the filler layer 170 and hardmask fin templates 131 that will be removed to form fin-cut trenches and fin-gaps.

Figure 17:
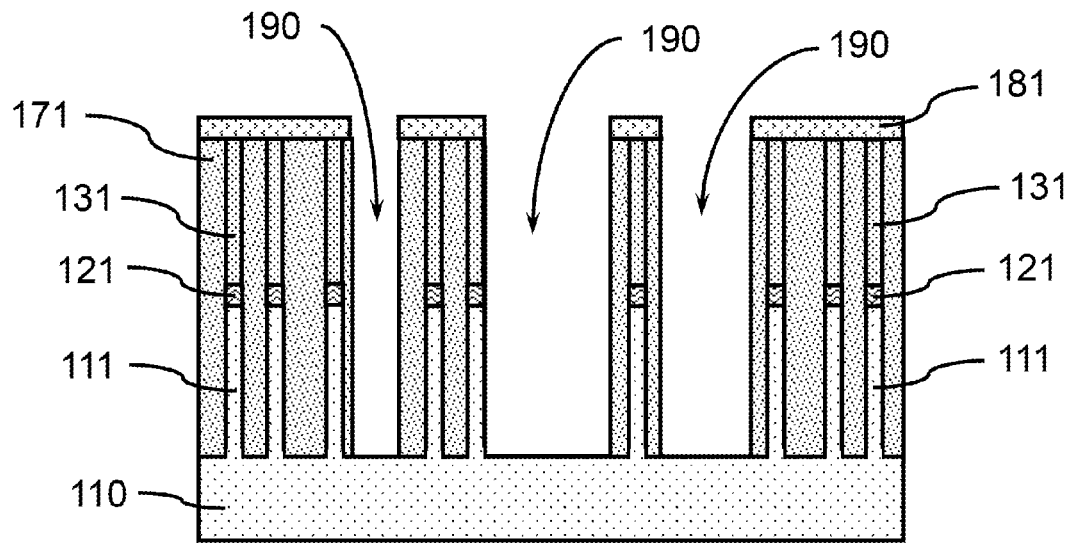
FIG. 17 shows a cross-sectional side view of a patterned fin-cut mask layer on the flat surface of the filler layer and hardmask fin templates with predetermined hardmask fin templates removed, in accordance with an embodiment of the present principles.

FIG. 17 shows a cross-sectional side view of a patterned fin-cut mask layer on the flat surface of the filler layer and hardmask fin templates with predetermined hardmask fin templates and vertical fins removed, in accordance with an embodiment of the present principles.

In one or more embodiments, the predetermined hardmask fin templates 131 exposed by the fin-cut mask blocks 181 may be removed, as well as a portion of the surrounding filler layer 170. The predetermined hardmask fin templates 131 may be removed by RIE to form one or more fin-gaps 190, where a fin-gap 190 may extend along the entire length of a hardmask fin template 131, template liner 121, and vertical fin 111, or include only a portion of the hardmask fin template 131, template liner 121, and vertical fin 111. One or more hardmask fin templates 131, template liners 121, and vertical fins 111 may be removed down to the level of the substrate 110 to form a fin-gap 190. The width of the fin-gap 190 may depend on the number of hardmask fin templates 131, template liners 121, and vertical fins 111, removed, and the pitch between the hardmask fin templates 131, template liners 121, and vertical fins 111.

In various embodiments, the remaining hardmask fin templates 131, template liners 121, and vertical fins 111 may form a plurality of devices (e.g., vertical finFETs) having single or multiple fins, where one or more vertical fins 111 may form a channel of a vertical finFET. In various embodiments, a vertical finFET may include multiple fins.

Figure 18:
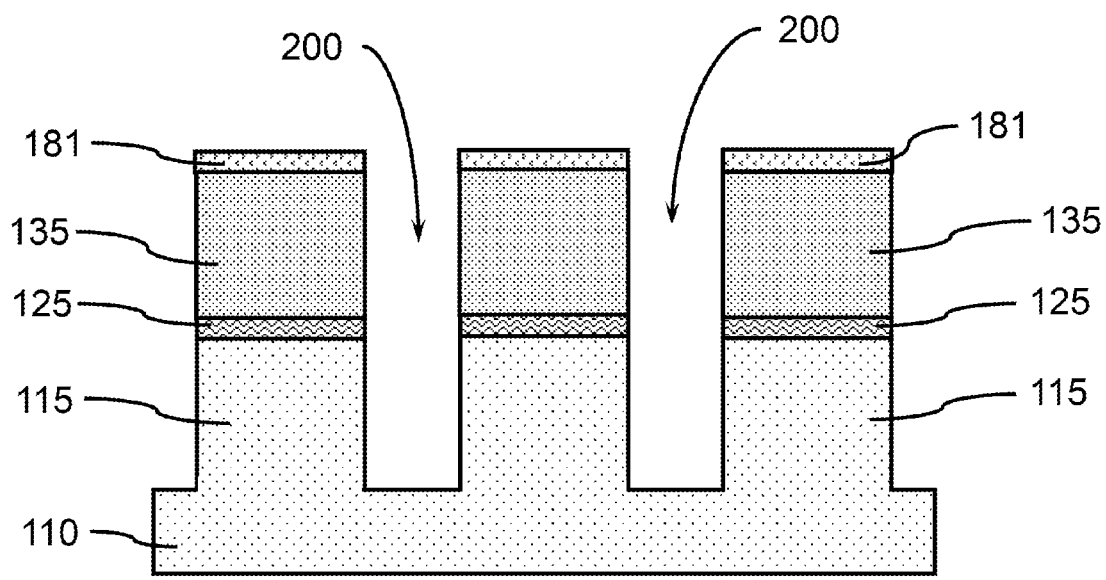
FIG. 18 shows a cross-sectional side view of the long axis of a patterned fin-cut mask layer on the hardmask fin templates, template liners, and vertical fins, with intervening fin trenches, in accordance with an embodiment of the present principles.

FIG. 18 shows a cross-sectional side view of the long axis of a patterned fin-cut mask layer on the hardmask fin templates, template liners, and vertical fins, with intervening fin trenches, in accordance with an embodiment of the present principles.

In one or more embodiments, one or more intervening fin trench(es) 200 may be formed to separate one or more hardmask fin template(s) 131, template liner(s) 121, and vertical fin(s) 111 into two or more hardmask fin template segments 135, template liner segments 125, and vertical fin segments 115. The separate stacks of hardmask fin template segments 135, template liner segments 125, and vertical fin segments 115 may have the same length or different lengths depending on the size and arrangement of the fin-cut mask blocks 181, and the distances between fin-cut mask blocks 181.

Figure 19:
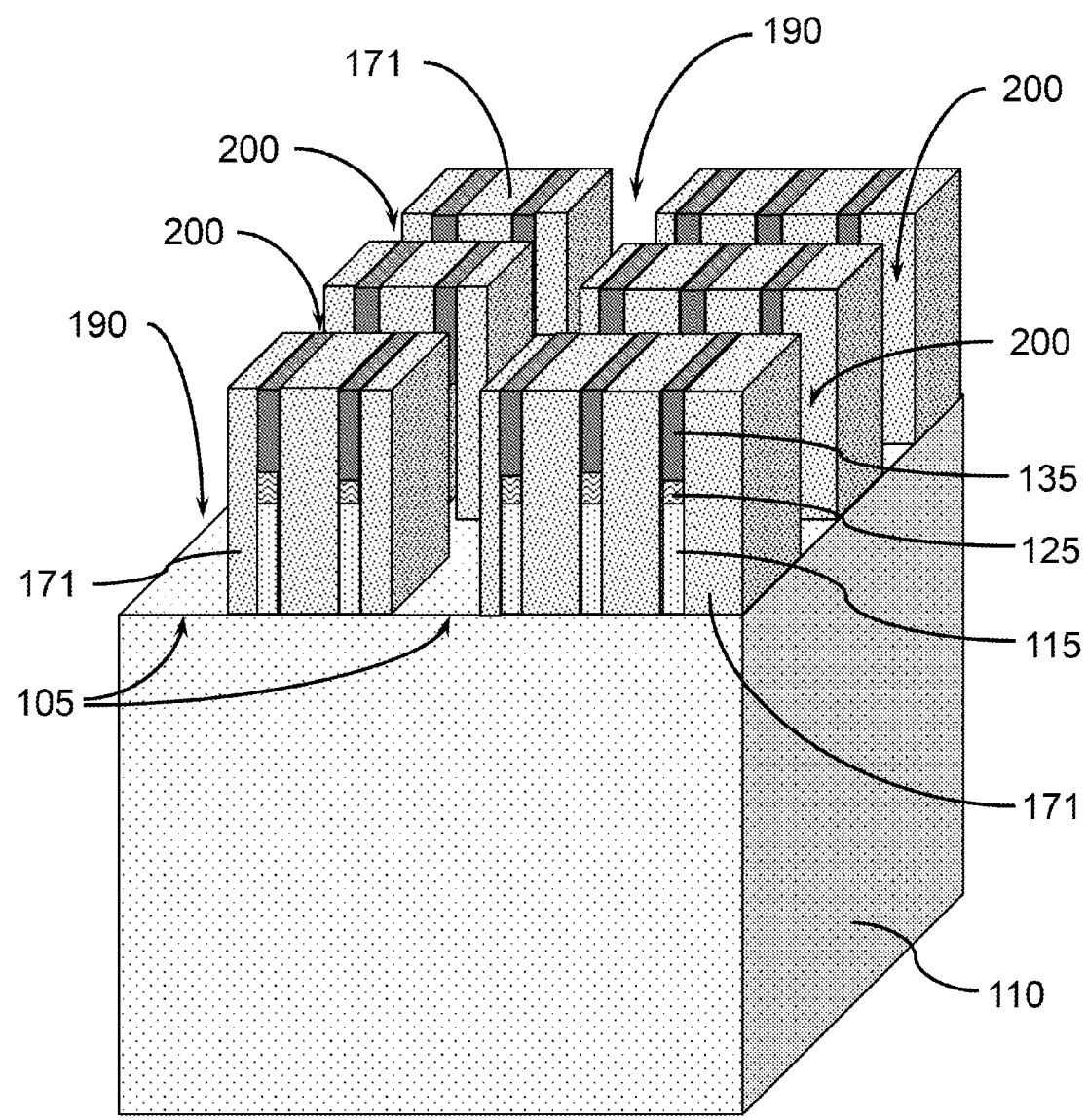
FIG. 19 shows a cross-sectional perspective view of patterned and etched filler layer, hardmask fin templates, template liners, and vertical fins, with intervening fin trenches and fin-gaps, in accordance with an embodiment of the present principles.

FIG. 19 shows a cross-sectional perspective view of patterned and etched filler layer blocks, hardmask fin templates, template liners, and vertical fins, with intervening fin trenches and fin-gaps, in accordance with an embodiment of the present principles.

In one or more embodiments, the filler layer 170 is divided into a plurality of filler layer blocks 171, and the hardmask fin template(s) 131, template liner(s) 121, and vertical fin(s) 111 are divided into two or more hardmask fin template segments 135, template liner segments 125, and vertical fin segments 115 by the intersecting fin trench(es) 200 and fin-gap(s) 190. In various embodiments, the fin trench(es) 200 may be approximately perpendicular (e.g., ±5°, ±3°) to the fin-gap(s) 190, where the fin gaps 190 align approximately with the location of one or more vertical fin(s) 111. The fin trench(es) 200 and fin-gap(s) 190 may extend down to the level at which the vertical fin segments 115 meet the substrate surface 105.

The fin-gap(s) 190 may be formed by removing one or more adjacent hardmask fin template(s) 131, template liner(s) 121, and vertical fin(s) 111. The fin trench(es) 200 may be formed by removing a portion of one or more hardmask fin template(s) 131, template liner(s) 121, and vertical fin(s) 111 across the long direction to form a column of two or more hardmask fin template segments 135, template liner segments 125, and vertical fin segments 115.

Figure 20:
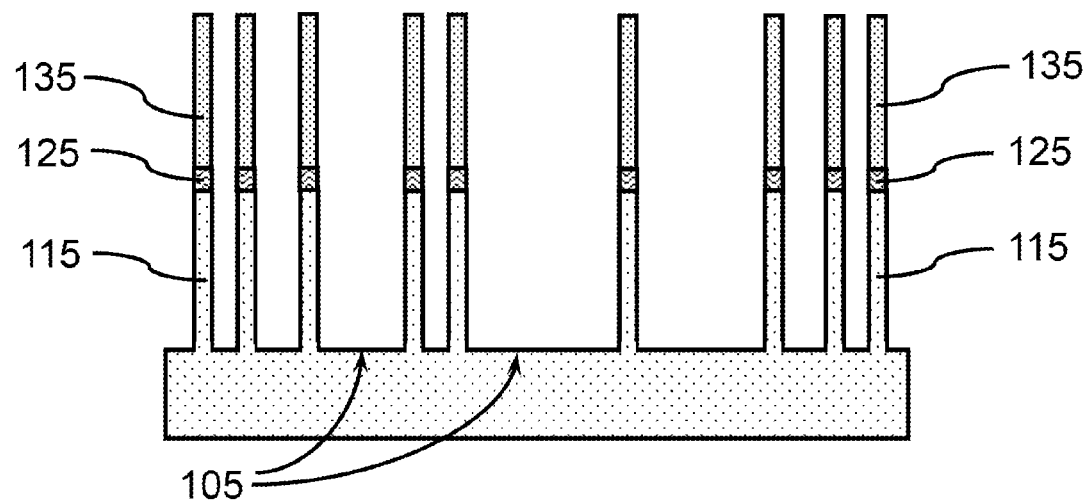
FIG. 20 shows a cross-sectional side view of a plurality of hardmask fin template segments, template liner segments, and vertical fin segments with intervening fin-gaps after removal of the protective liner and/or filler layer blocks, in accordance with an embodiment of the present principles.

FIG. 20 shows a cross-sectional side view of a plurality of hardmask fin template segments, template liner segments, and vertical fin segments with intervening fin-gaps after removal of the protective liner and/or filler layer blocks, in accordance with an embodiment of the present principles.

In various embodiments, the filler layer blocks 171 may be removed to expose the substrate surface 105, hardmask fin template segments 135, template liner segments 125, and vertical fin segments 115. In embodiments having a protective liner 175 between the filler layer blocks 171 and hardmask fin template segments 135, template liner segments 125, and vertical fin segments 115, the protective liner 175 may also be removed. The filler layer blocks 171 and protective liner 175 may be removed by separate etching processes selective for the material of the filler layer blocks 171 and protective liner 175.

Figure 21:
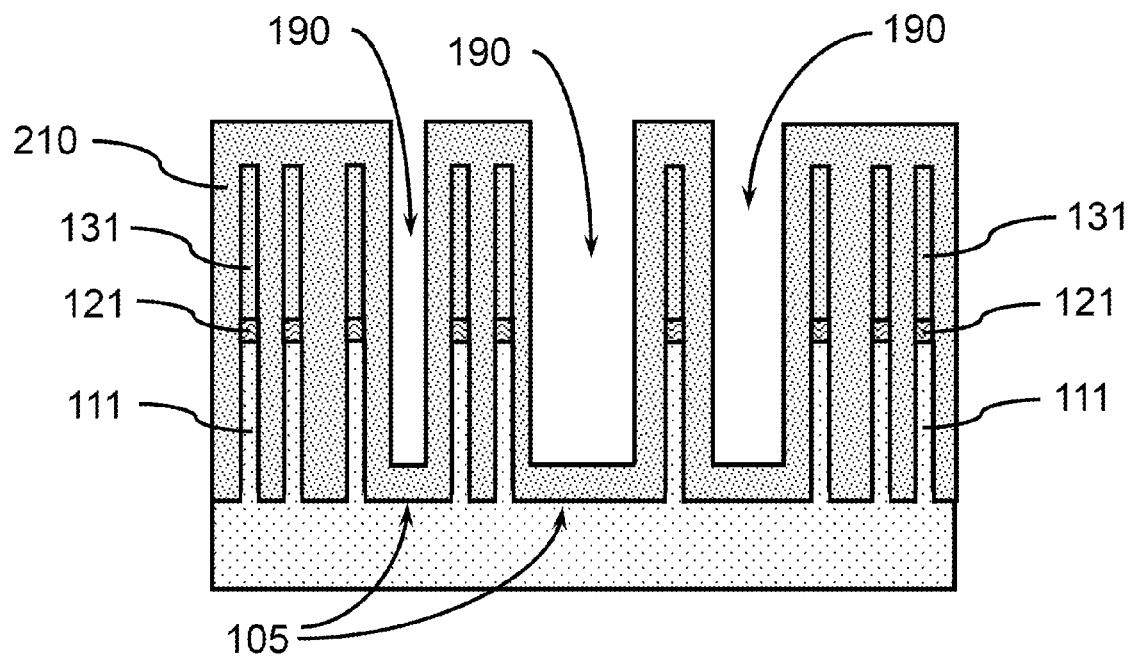
FIG. 21 shows a cross-sectional side view of a plurality of hardmask fin template segments, template liner segments, and vertical fin segments covered by a pinch-off layer, in accordance with an embodiment of the present principles.

FIG. 21 shows a cross-sectional side view of a plurality of hardmask fin template segments, template liner segments, and vertical fin segments covered by a pinch-off layer, in accordance with an embodiment of the present principles.

In one or more embodiments, a pinch-off layer 210 may be formed on the hardmask fin template segments 135, template liner segments 125, and vertical fin segments 115. In various embodiments, the pinch-off layer 210 may be conformally deposited on the sidewalls and/or endwalls of the hardmask fin template segments 135, template liner segments 125, and vertical fin segments 115.

In various embodiments, the pinch-off layer 210 may fill in the space between the adjacent hardmask fin template segments 135, template liner segments 125, and vertical fin segments 115, while leaving an opening between hardmask fin template segments 135, template liner segments 125, and vertical fin segments 115 on opposite sides of a fin-gap 190. The pinch-off layer 210 may be formed on portions of the substrate surface 105 in the fin-gap 190.

In various embodiments, the pinch-off layer 210 may have a thickness in the range of about 0.1 nm to about 25 nm, or in the range of about 1 nm to about 20 nm, or in the range of about 3 nm to about 10 nm, or in the range of about 5 nm to about 25 nm, or in the range of about 10 nm to about 20 nm. The pinch-off layer 210 may be formed by atomic layer deposition (ALD), where the thickness of the pinch-off layer 210 may be controlled to a thickness of one monolayer of the material being deposited. In various embodiments, the pinch-off layer 210 may include, but not be limited to, $SiO_2$, SiN, SiON, or TiN. The pinch-off layer may be a conformal layer deposited by ALD.

Figure 22:
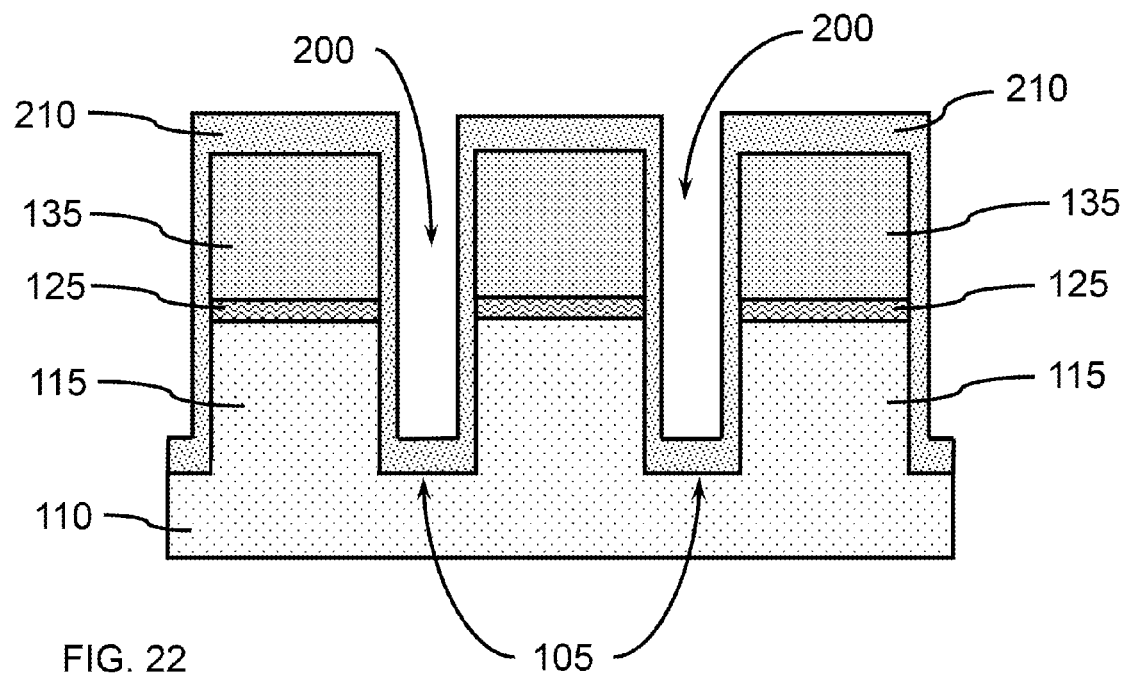
FIG. 22 shows a cross-sectional side view of the long axis of hardmask fin template segments, template liner segments, and vertical fin segments, with a pinch-off layer, in accordance with an embodiment of the present principles.

FIG. 22 shows a cross-sectional side view of the long axis of hardmask fin template segments, template liner segments, and vertical fin segments, with a pinch-off layer, in accordance with an embodiment of the present principles.

In various embodiments, the pinch-off layer 210 may cover portions of the substrate surface 105 exposed in the fin trench(es) 200 between hardmask fin template segments 135, template liner segments 125, and vertical fin segments 115.

Figure 23:
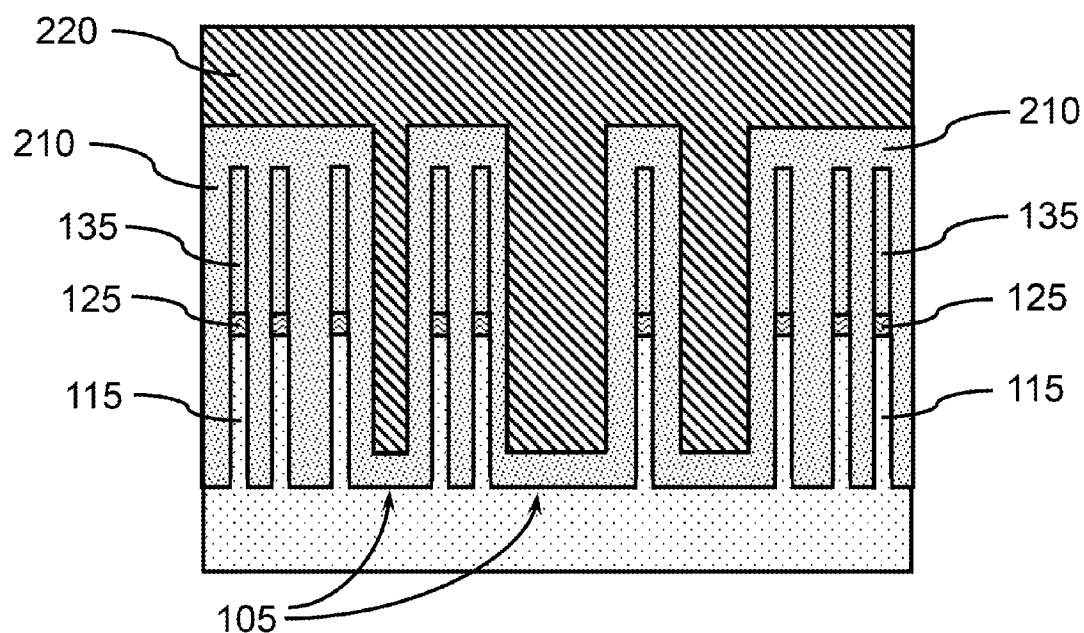
FIG. 23 shows a cross-sectional side view of a plurality of hardmask fin template segments, template liner segments, and vertical fin segments covered by a trench mask layer, in accordance with an embodiment of the present principles.

FIG. 23 shows a cross-sectional side view of a plurality of hardmask fin template segments, template liner segments, and vertical fin segments covered by a trench mask layer, in accordance with an embodiment of the present principles.

In one or more embodiments, a trench mask layer 220 may be formed on at least selective portions of the pinch-off layer 210, where the trench mask layer 220 may fill in one or more fin trench(es) 200 and/or fin-gap(s) 190. The trench mask layer 220 may extend above the top surface(s) of the pinch-off layer 210 on the hardmask fin template segments 135. The trench mask layer 220 may cover portions of the pinch-off layer 210 on the substrate surface 105.

In various embodiments, the trench mask layer 220 may be an organic lithography material, as would be known in the art, for example, an organic planarization layer, that may allow etching of both an oxide and a nitride at the same time. In various embodiments, the trench mask layer 220 may be formed on the pinch-off layer 210 and in the one or more fin trench(es) 200 and/or fin-gap(s) 190 by a spin-on process, as would be known in the art.

Figure 24:
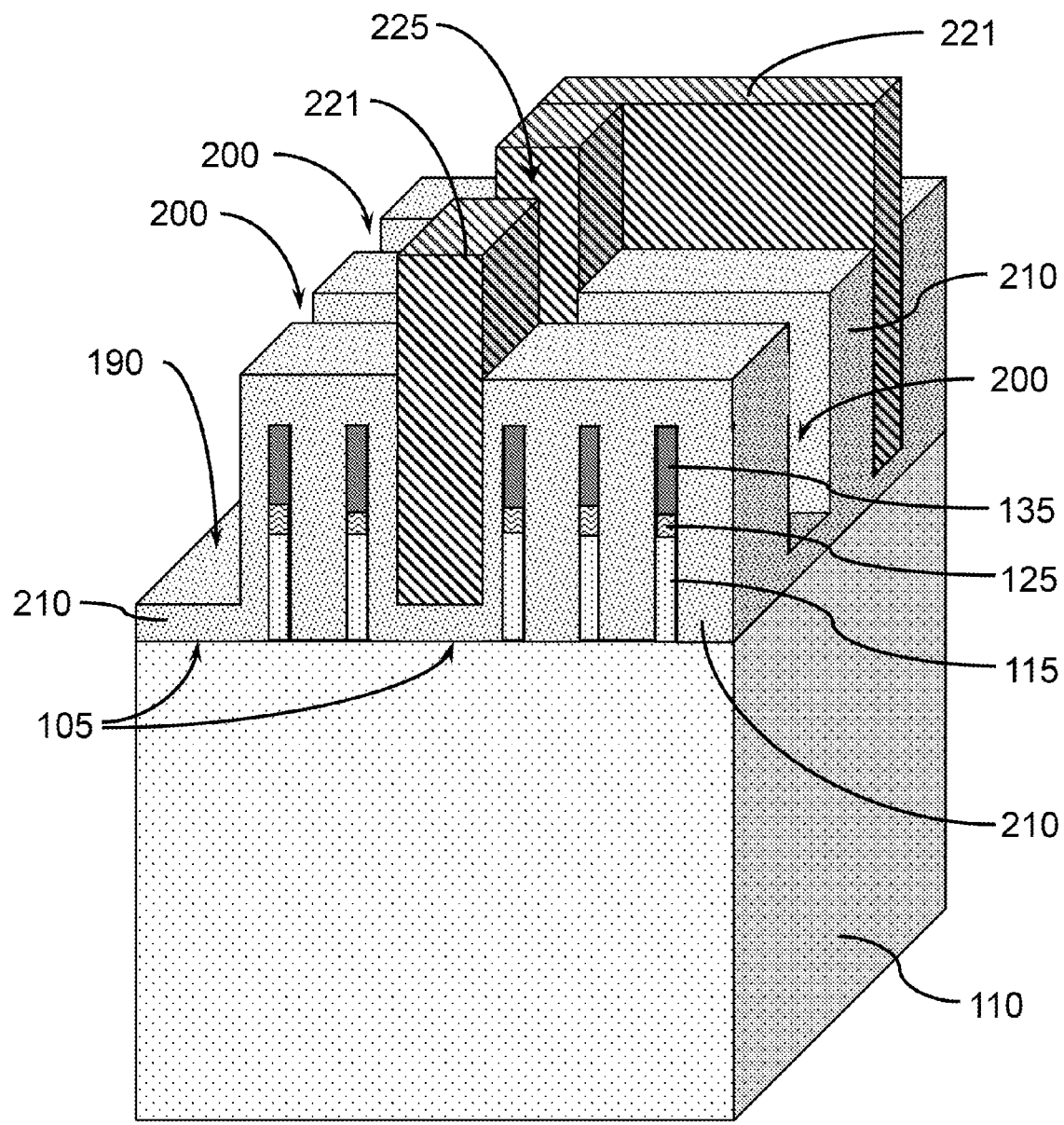
FIG. 24 shows a cross-sectional perspective view of patterned and etched trench mask in a fin-gap and fin trench between filler layer blocks, in accordance with an embodiment of the present principles.

FIG. 24 shows a cross-sectional perspective view of patterned and etched trench mask in a fin-gap and portion of a fin trench, in accordance with an embodiment of the present principles.

In one or more embodiments, portion(s) of the trench mask layer 220 may be removed, while leaving one or more trench mask blocks 221 in one or more fin-gaps 190 and/or one or more fin trench(es) 200. The trench mask blocks 221 may protect portions of pinch-off layer 210 and the substrate surface 105 in the fin-gaps 190 and/or fin trenches 200 from etching during formation of isolation region trenches.

In one or more embodiments, a soft mask may be formed and patterned on the trench mask layer 220. Portions of the trench mask layer 220 may be removed to expose portions of the pinch-off layer 210 on the substrate surface 105. The pinch-off layer 210 on the substrate surface 105 may subsequently be removed to expose portions of the substrate surface 105 at the bottom of one or more previously formed fin trench(es) 200 and/or fin-gap(s) 190. Removal of portions of the trench mask layer 220 can form one or more trench mask openings 225.

In various embodiments, the thickness of the pinch-off layer 210 on the sidewalls of the hardmask fin template segments 135, template liner segments 125, and vertical fin segments 115 defines the lateral distance form a vertical fin segment 115 that a shallow trench isolation region may be formed.

Figure 25:
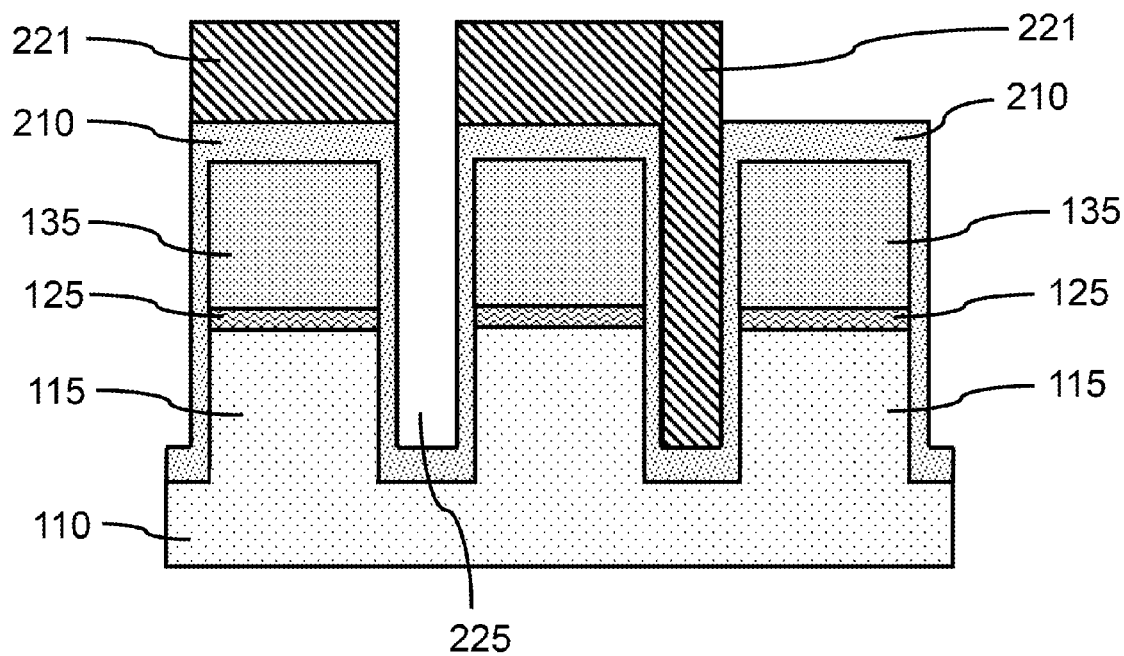
FIG. 25 shows a partial cross-section and side view of the long axis of vertical fin segments of FIG. 24 showing a plurality of trench mask blocks in fin trenches and fin-gaps, in accordance with an embodiment of the present principles.

FIG. 25 shows a partial cross-section and side view of the long axis of vertical fin segments of FIG. 24 showing a plurality of trench mask blocks in fin trenches and fin-gaps, in accordance with an embodiment of the present principles.

A trench mask block 221 may fill a portion of a fin-gap 190 between two adjacent sidewalls of the pinch-off layer 210 on the sidewalls of the hardmask fin template segments 135, template liner segments 125, and vertical fin segments 115. The trench mask block 221 may also fill a portion of one or more fin trench(es) 200. The trench mask block 221 may extend above the top surface of the pinch-off layer 210.

Figure 26:
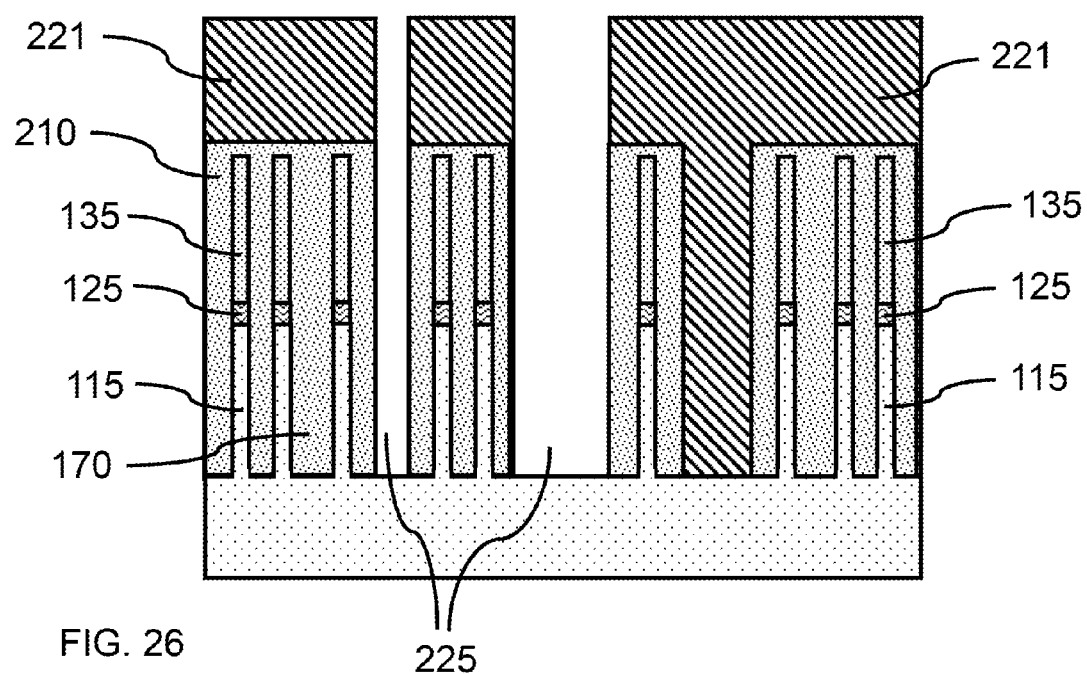
FIG. 26 shows a side view of a plurality of trench mask openings extending along the fin-gaps and trench mask blocks in the fin trench behind the pinch-off layer covered vertical fin segments, in accordance with an embodiment of the present principles.

FIG. 26 shows a side view of a plurality of trench mask openings extending along the fin-gaps and trench mask blocks in the fin trench behind the pinch-off layer covered vertical fin segments, in accordance with an embodiment of the present principles.

In one or more embodiments, the trench mask layer 220 may be removed from an entire fin-gap 190, and/or from an entire fin trench 200 where an isolation region trench may be formed to separate bottom source/drains and electrically isolate one or more vertical finFETs. The increased distance between vertical fin segments 115 across a fin gap 190 may provide space for the formation of shallow trench isolation regions.

Figure 27:
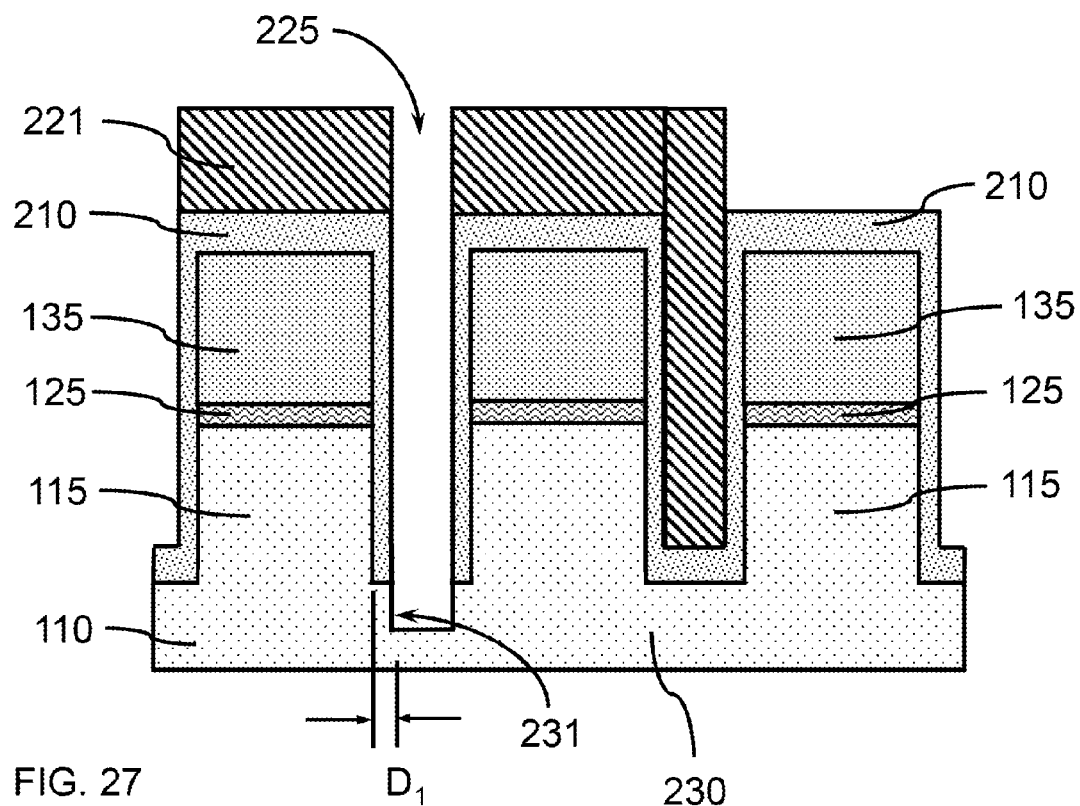
FIG. 27 shows a partial cross-section and side view of the long axis of vertical fin segments of FIG. 24 showing an isolation region trench extending into the substrate, and trench mask blocks shown in a fin gap behind the pinch-off layer covered vertical fin segments, in accordance with an embodiment of the present principles.

FIG. 27 shows a partial cross-section and side view of the long axis of vertical fin segments of FIG. 24 showing an isolation region trench extending into the substrate, and trench mask blocks shown in a fin gap behind the pinch-off layer covered vertical fin segments, in accordance with an embodiment of the present principles.

In one or more embodiments, the trench mask openings 225 may be extended into the substrate along at least a portion of a fin trench 200, where a portion of the substrate may be removed to form one or more isolation region trenches 230 in the substrate 110. The substrate may be removed to form one or more isolation region trenches 230 between one or more hardmask fin template segments 135, template liner segments 125, and vertical fin segments 115 in the same column. The isolation region trenches 230 may form isolation regions (e.g., shallow trench isolation regions, deep trench isolation regions) in the substrate between devices. In various embodiments, the isolation region trenches 230 may be formed by an anisotropic dry plasma etch (e.g., RIE) that does not etch the pinch off layer sidewalls. The etching of the trench may be selective for the substrate material, such that the pinch-off layer 210 remains on the hardmask fin template segments 135 and vertical fin segments 115. In a non-limiting example, a silicon substrate may be selectively etched by RIE, while a silicon oxide pinch-off layer 210 remains on the hardmask fin template segments 135, template liner segments 125, and vertical fin segments 115.

In one or more embodiments, a sidewall 231 of the isolation region trenches 230 may be offset from the vertical fin segment 115 by a distance, Di, equal to or approximately equal to the thickness of the pinch-off layer 210, where the pinch-off layer may act as a hardmask to shield a portion of the substrate during formation of the isolation region trench(es) 230. In various embodiments, the distance, Di, may be in the range of about 0.1 nm to about 25 nm, or in the range of about 1 nm to about 20 nm, or in the range of about 3 nm to about 10 nm, or in the range of about 5 nm to about 25 nm, or in the range of about 10 nm to about 20 nm. In various embodiments, the thickness of the pinch-off layer 210 may be the thickness of a conformal monolayer deposited by ALD, and the distance, Di, may be the thickness of the monolayer. The thickness of the pinch-off layer may be controlled to a tolerance of approximately one monolayer by the ALD.

Figure 28:
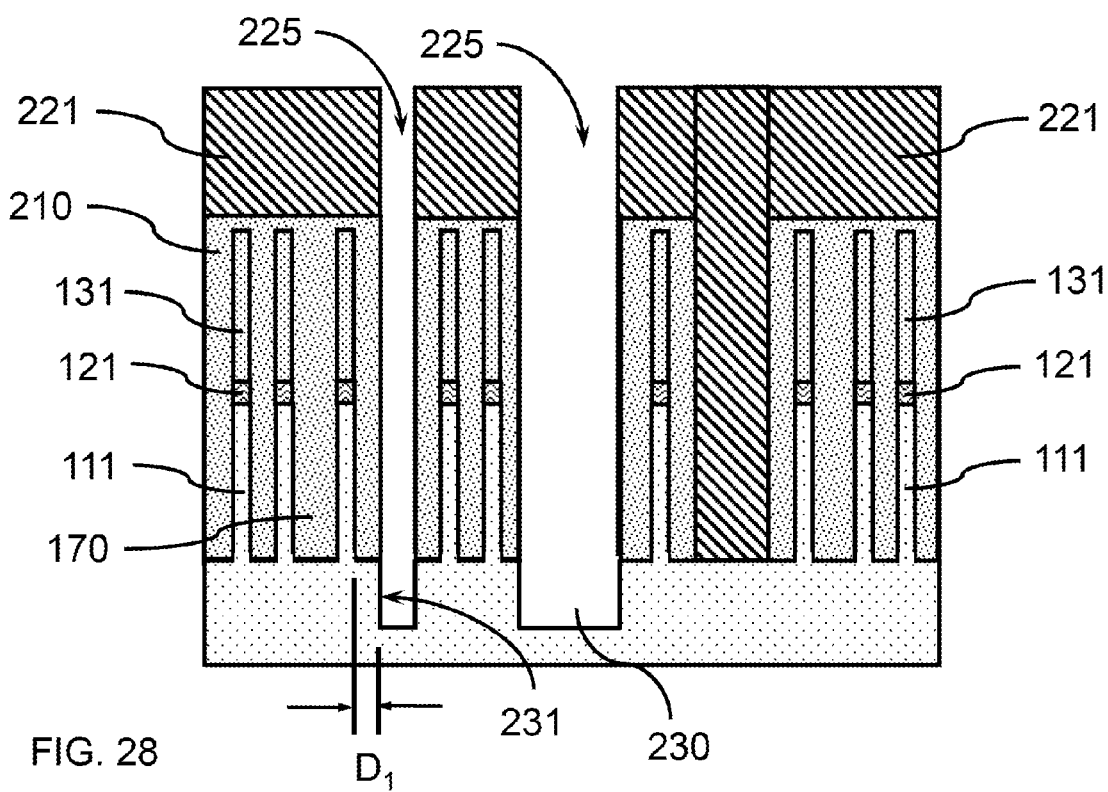
FIG. 28 shows a cross-sectional side view of a plurality of isolation region trenches extending into the substrate between adjacent hardmask fin template segments, template liner segments, and vertical fin segments, in accordance with an embodiment of the present principles.

FIG. 28 shows a cross-sectional side view of a plurality of isolation region trenches extending into the substrate with trench mask blocks shown in a fin gap behind the pinch-off layer covered vertical fin segments, in accordance with an embodiment of the present principles.

In one or more embodiments, the trench mask openings 225 may be extended into the substrate along at least a portion of a fin gap 190, where a portion of the substrate may be removed to form one or more isolation region trenches 230 in the substrate 110. The portion(s) of the substrate 110 may be removed by a directional RIE to form the isolation region trenches 230 in the substrate below the substrate surface 105 and the level of the vertical fin segment 115, where a sidewall 231 of the isolation region trenches 230 may be offset from the vertical fin segment 115 by a distance, Di, equal to or approximately equal to the thickness of the pinch-off layer 210 on the sidewalls of the hardmask fin template segments 135, template liner segments 125, and vertical fin segments 115.

In various embodiments, the depth of the isolation region trench(es) 230 may be in the range of about 10 nm to about 300 nm, or in the range of about 30 nm to about 200 nm, or in the range of about 40 nm to about 100 nm. The depth of the isolation region trench(es) 230 may extend below the depth of a doped region forming a bottom source/drain.

In one or more embodiments, the isolation region trenches 230 may be filled with a dielectric material to form one or more shallow trench isolation regions.

Figure 29:
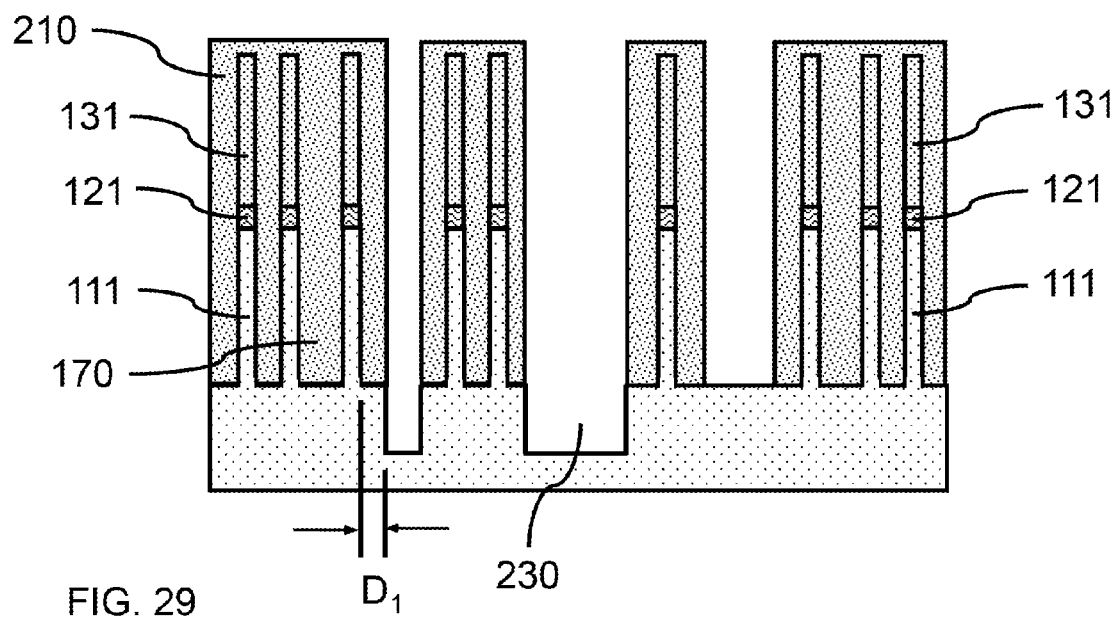
FIG. 29 shows a cross-sectional side view of a plurality of isolation region trenches extending into the substrate between adjacent hardmask fin template segments, template liner segments, and vertical fin segments, in accordance with an embodiment of the present principles.

FIG. 29 shows a cross-sectional side view after removal of the trench mask layer, in accordance with an embodiment of the present principles.

In one or more embodiments, the trench mask layer 220 may be removed after formation of the isolation region trenches 230. The trench mask layer 220 may be removed by a RIE process to expose the pinch-off layer 210 over hardmask fin template segments. In various embodiments, the trench mask layer 220 may be an organic resist material that may be removed by an oxygen ashing process.

Figure 30:
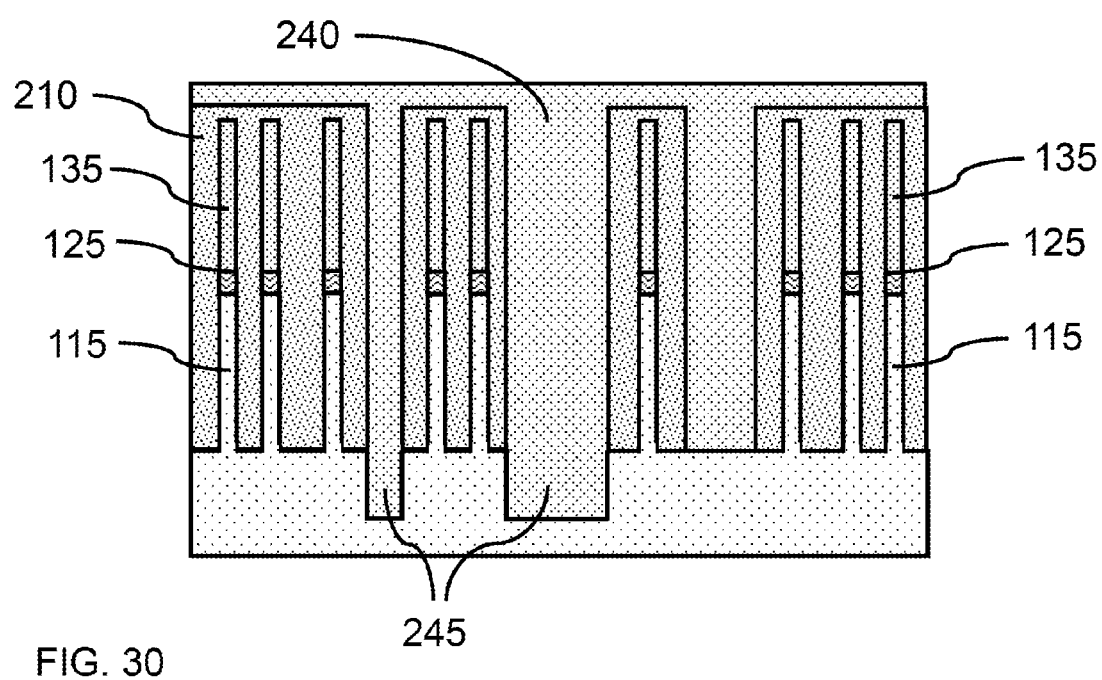
FIG. 30 shows a cross-sectional side view of hardmask fin template segments, template liner segments, and vertical fin segments, with a dielectric fill layer in the trench mask openings and isolation region trenches, in accordance with an embodiment of the present principles.

FIG. 30 shows a cross-sectional side view of a dielectric fill layer over the pinch-off layer and in the trench mask openings and isolation region trenches, in accordance with an embodiment of the present principles.

In one or more embodiments, a dielectric fill layer 240 may be formed in the trench mask openings 225 and isolation region trenches 230. The dielectric fill layer 240 may be silicon dioxide ($SiO_2$). In various embodiments, the dielectric fill layer 240 may be the same material as the pinch-off layer 210, such that both the dielectric fill layer and the pinch-off layer may be etched back in the same process.

Figure 31:
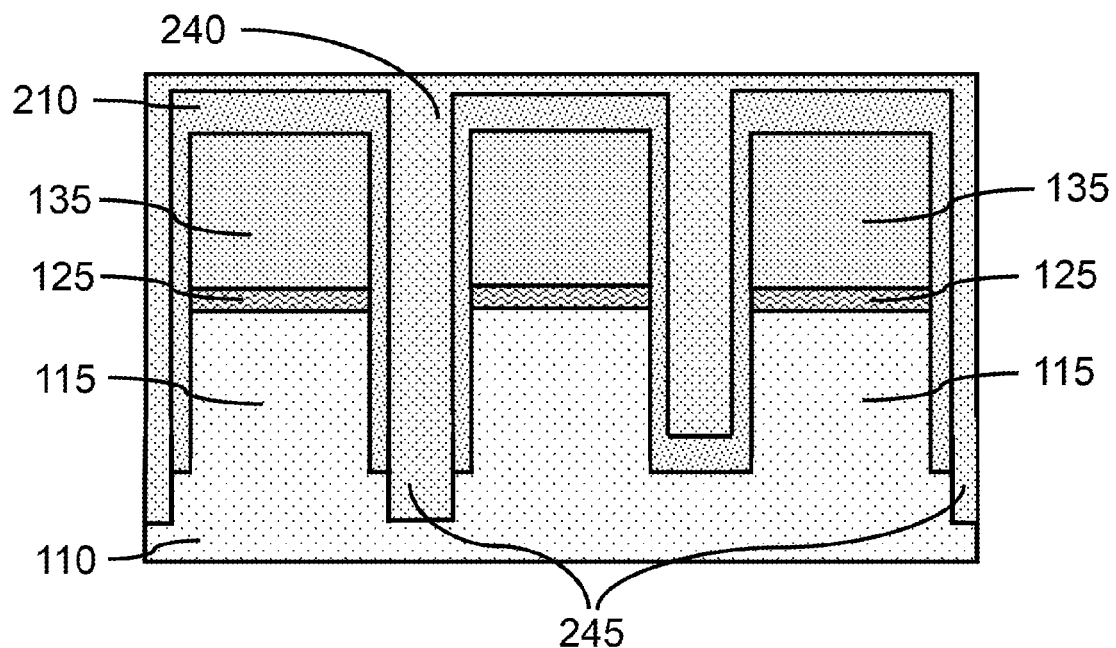
FIG. 31 shows a cross-sectional side view of the long axis of hardmask fin template segments, template liner segments, and vertical fin segments, with a dielectric fill layer in the trench mask openings and isolation region trenches, in accordance with an embodiment of the present principles.

FIG. 31 shows a cross-sectional side view of the long axis of hardmask fin template segments, template liner segments, and vertical fin segments, with a dielectric fill layer in the trench mask openings and isolation region trenches, in accordance with an embodiment of the present principles.

In one or more embodiments, the dielectric fill layer 240 may be formed in fin trench(es) 200 between one or more hardmask fin template segments 135, template liner segments 125, and vertical fin segments 115 in the same column.

The dielectric fill layer 240 may be an oxide formed, for example, by a low pressure CVD (LPCVD) process, flowable CVD (FCVD) process, enhanced High Aspect Ratio Process (eHARP) process, High Aspect Ratio Process (HARP) process, high density plasma (HDP) process, or a combination thereof. The dielectric fill layer 240 may extend above the top surface of the hardmask fin template segments 135, and a CMP may be used to reduce the height of the dielectric fill layer 240 and provide a flat uniform surface. A heat treatment (e.g., annealing, etc.) may be used to densify the formed oxide.

Figure 32:
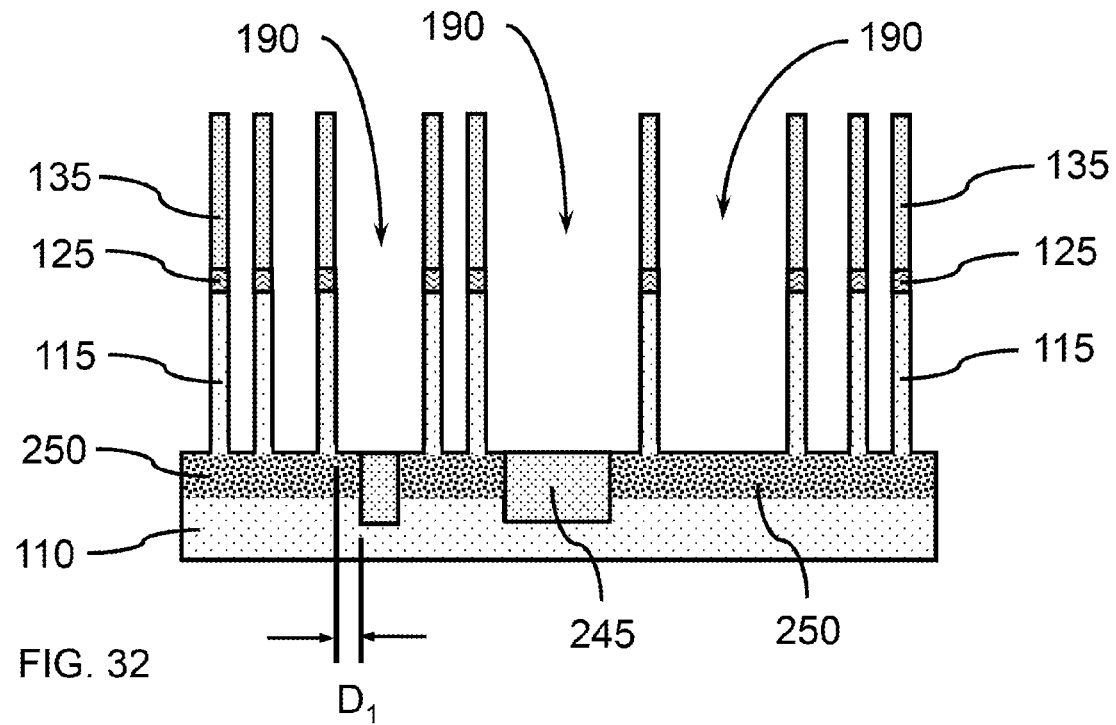
FIG. 32 shows a cross-sectional side view of a plurality of free-standing hardmask fin template segments, template liner segments, and vertical fin segments, after removal of the pinch-off layer and a portion of the dielectric fill layer, in accordance with an embodiment of the present principles.

FIG. 32 shows a cross-sectional side view of a plurality of free-standing hardmask fin template segments, template liner segments, and vertical fin segments, after removal of the pinch-off layer and a portion of the dielectric fill layer, in accordance with an embodiment of the present principles.

In one or more embodiments, portion of the dielectric fill layer 240 may be removed, from the trench mask openings 225, where a portion of the dielectric fill layer 240 may remain in the isolation region trenches 230 to form shallow trench isolation regions 245 in the isolation region trenches 230 of the fin-gap(s) 190. The shallow trench isolation regions 245 may separate doped regions 250 into separate bottom source/drains for separate finFETs.

Figure 33:
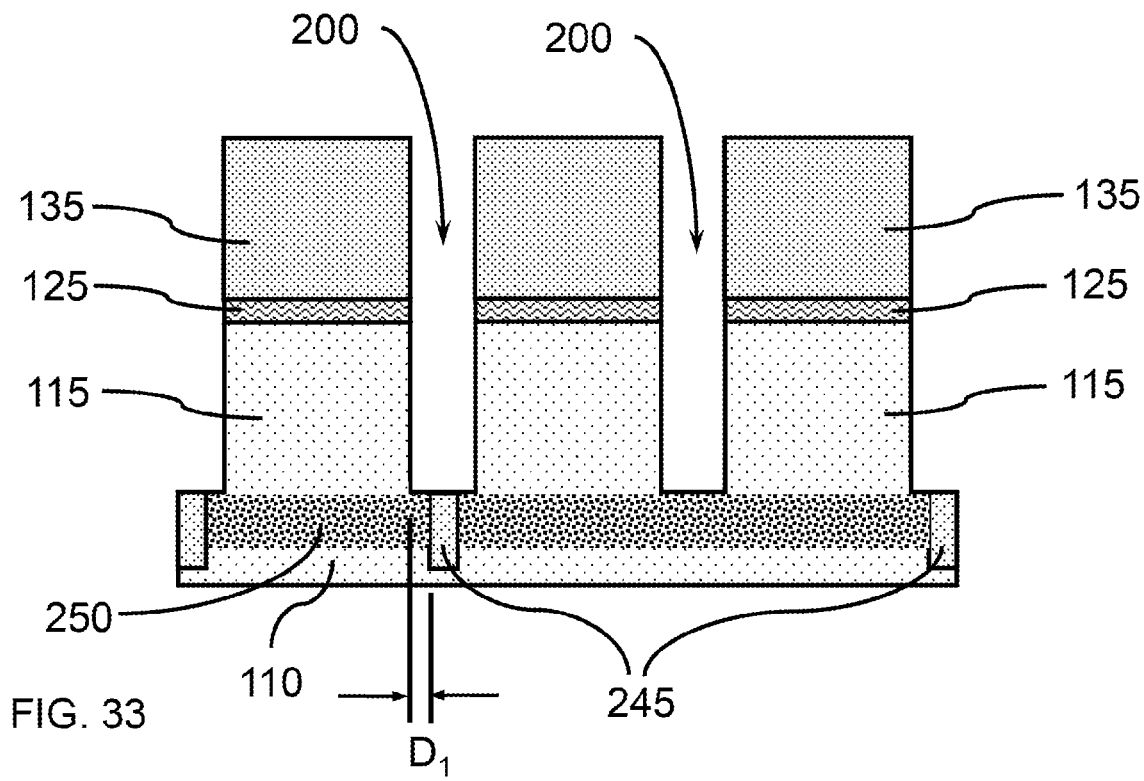
FIG. 33 shows a cross-sectional side view of the long axis of hardmask fin template segments, template liner segments, and vertical fin segments, after removal of the pinch-off layer and a portion of the dielectric fill layer, in accordance with an embodiment of the present principles.

FIG. 33 shows a cross-sectional side view of the long axis of hardmask fin template segments, template liner segments, and vertical fin segments, after removal of the pinch-off layer and a portion of the dielectric fill layer, in accordance with an embodiment of the present principles.

In one or more embodiments, dielectric fill layer 240 may be formed in the isolation region trenches 230 of the fin trench(es) 200, and portion of the dielectric fill layer 240 may be removed to form shallow trench isolation regions 245.

In one or more embodiments, the dielectric fill layer 240 and pinch-off layer 210 may be etched back to the surface of the substrate to leave the shallow trench isolation (STI) regions 245 in the substrate 110 between the vertical fin segments 115.

Figure 34:
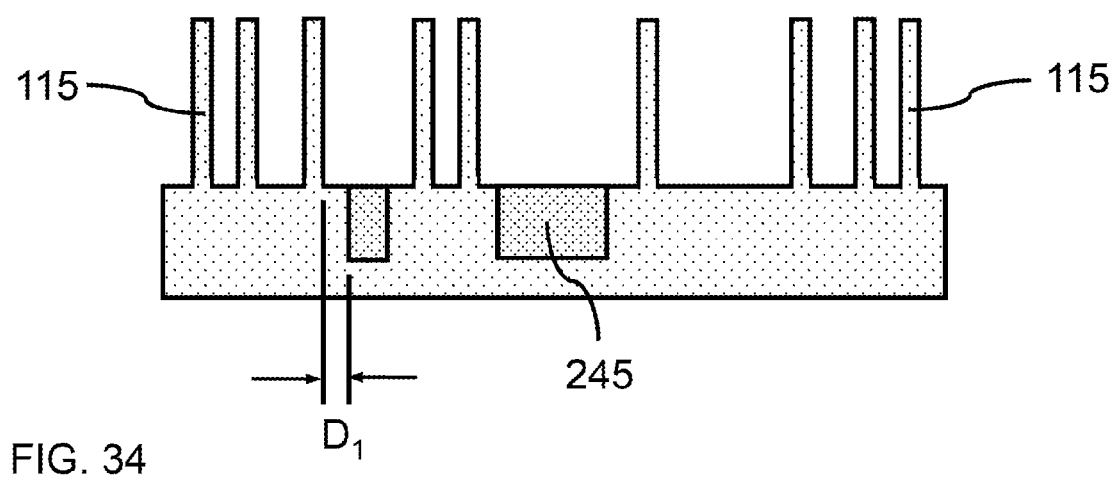
FIG. 34 shows a cross-sectional side view of a plurality of free-standing vertical fin segments, and self-aligned shallow trench isolation regions, in accordance with an embodiment of the present principles.

FIG. 34 shows a cross-sectional side view of a plurality of free-standing vertical fin segments, and self-aligned shallow trench isolation regions, in accordance with an embodiment of the present principles.

In one or more embodiments, the shallow trench isolation regions 245 are self-aligned with the vertical fin segments 115 due to the control of the positioning of the isolation region trenches 230 by the thickness of the pinch-off layer 210 on the sidewalls and/or endwalls of the vertical fins. Since the positioning of the isolation region trenches 230 is not controlled by the lateral accuracy of a masking process, the isolation region trench positioning can be controlled to a tolerance of one or more monolayers through an ALD process forming the pinch-off layer 210.

In one or more embodiments, the doped regions 250 in the substrate 110 below the vertical fin(s) may form bottom source/drains for a finFET, where the hallow trench isolation regions 245 define a perimeter of the bottom source/drain for one or more vertical fin segments 115. The bottom source/drain(s) may be formed by in-situ doping or ex-situ doping.

A non-limiting example of a method of forming a vertical fin field effect transistor (vertical finFET) with a self-aligned shallow trench isolation region, includes forming one or more vertical fins on a substrate; forming a filler layer in the gaps between each of the one or more vertical fins; forming and patterning a fin-cut mask layer on at least a portion of the surface of the filler layer and vertical fins to form a plurality of fin-cut mask blocks; removing portions of the filler layer and vertical fins not covered by the fin-cut mask blocks to form one or more vertical fin segments; forming a pinch-off layer on the one or more vertical fin segments, wherein the pinch-off layer has a thickness on the sidewalls of the one or more vertical fin segments; forming a trench mask layer on predetermined portions the pinch-off layer; removing portions of the pinch-off layer not covered by the trench mask layer, where the removed portions of the pinch-off layer exposes underlying portions of the substrate; and removing at least a portion of the substrate to form one or more isolation region trenches, where the distance of the sidewall of one of the one or more isolation region trenches to an adjacent vertical fin segment is determined by the thickness of the pinch-off layer.

It is to be understood that the present invention is described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C)

only, or the selection of all three options (A and B and C). This may be extended, as readily apparent by one of ordinary skill in this and related arts, for as many items listed.

The terminology used herein is for the purpose of describing particular embodiments only and is plot intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to anotherelement(s) or feature(s) as illustrated in the FIGs. It will be understood that the spatially relative terms are intended to encompass different orientations of the device in use or operation in addition to the orientation depicted in the FIGs. For example, if the device in the FIGs. is turned over, elements described as "below" or "beneath" other elements or features would then be oriented "above" the other elements or features. Thus, the term "below" encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

While exemplary embodiments have been shown for a particular device, it should be understood that a plurality of such devices may be arranged and/or fabricated on a substrate to form integrated devices that may be integrated onto a substrate, for example through very large scale integration to produce complex devices such a central processing units (CPUs) and application specific integrated circuits (ASICs). The present embodiments may be part of a device or circuit, and the circuits as described herein may be part of a design for an integrated circuit chip.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a vertical fin field effect transistor (vertical finFET) with a self-aligned shallow trench isolation region, comprising:

forming a pinch-off layer on one or more vertical fin segments, wherein the pinch-off layer has a thickness on the sidewalk of the one or more vertical fin segments;

forming a trench mask layer on predetermined portions of the pinch-off layer;

removing portions of the pinch-off layer not covered by the trench mask layer, where the removed portions of the pinch-off layer exposes underlying portions of the substrate; and removing at least a portion of the substrate to form one or more isolation region trenches, where the distance of the sidewall of one of the one or more isolation region trenches to an adjacent vertical fin segment is determined by the thickness of the pinch-off layer.

2. The method of claim 1, wherein the pinch-off layer is formed on the one or more vertical fin segments by atomic layer deposition (ALD).

3. The method of claim 2, wherein the thickness of the pinch-off layer is controlled to approximately one monolayer by the ALD.

4. The method of claim 3, wherein pinch-off layer is silicon oxide.

5. The method of claim 1, further comprising filling the one or more isolation region trenches with a dielectric fill layer to form one or more shallow trench isolation regions.

6. The method of claim 1, further comprising removing one or more vertical fin segments to form a fin-gap between two adjacent vertical fin segments, wherein one of the one or more isolation region trenches is formed in the fin-gap.

7. The method of claim 1, wherein the pinch-off layer has a thickness sufficient to completely fill in the space between adjacent vertical fin segments.

8. The method of claim 1, further comprising removing one or more portions of the trench mask layer to form a plurality of trench mask blocks separated by fin trenches and fin-gaps.

9. A method of forming a vertical fin field effect transistor (vertical finFET) with a self-aligned shallow trench isolation region, comprising:

forming one or more vertical fins by a sidewall image transfer process;

forming a pinch-off layer on one or more vertical fin segments, wherein the pinch-off layer has a thickness on the sidewalk of the one or more vertical fin segments;

forming a trench mask layer on predetermined portions of the pinch-off layer;

removing portions of the pinch-off layer not covered by the trench mask layer, where the removed portions of the pinch-off layer exposes underlying portions of the substrate; and removing at least a portion of the substrate to form one or more isolation region trenches, where the distance of the sidewall of one of the one or more isolation region trenches to an adjacent vertical fin segment is determined by the thickness of the pinch-off layer.

10. The method of claim 9, further comprising filling the one or more isolation region trenches with a dielectric fill layer to form one or more shallow trench isolation regions.

11. The method of claim 10, wherein the pinch-off layer is formed on the one or more vertical fin segments by atomic layer deposition (ALD).

12. The method of claim 10, wherein dielectric fill layer is silicon dioxide ($SO_2$).

13. The method of claim 9, wherein the pinch-off layer has a thickness in the range of about 0.1 nm to about 25 nm.

14. The method of claim 9, wherein the one or more isolation region trench(es) has a depth in the range of about 5 nm about 200 nm.

15. The method of claim 9, wherein the pinch-off layer is $SiO_2$, SiN, SiON, or TiN.

* * * * *